(12) United States Patent
Cheng et al.

(10) Patent No.: US 12,120,916 B2
(45) Date of Patent: Oct. 15, 2024

(54) DISPLAY SUBSTRATE, PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Bo Cheng, Beijing (CN); Mengmeng Du, Beijing (CN); Jie Gou, Beijing (CN); Xiangdan Dong, Beijing (CN); Hongwei Ma, Beijing (CN); Shuangbin Yang, Beijing (CN); Yujing Li, Beijing (CN); Zhenhua Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 640 days.

(21) Appl. No.: 17/435,046

(22) PCT Filed: Nov. 26, 2020

(86) PCT No.: PCT/CN2020/131740
§ 371 (c)(1),
(2) Date: Aug. 31, 2021

(87) PCT Pub. No.: WO2022/109919
PCT Pub. Date: Jun. 2, 2022

(65) Prior Publication Data
US 2023/0180521 A1   Jun. 8, 2023

(51) Int. Cl.
*H10K 59/12* (2023.01)
*H10K 59/121* (2023.01)
(Continued)

(52) U.S. Cl.
CPC ..... *H10K 59/1213* (2023.02); *H10K 59/1201* (2023.02); *H10K 59/1216* (2023.02);
(Continued)

(58) Field of Classification Search
CPC .......... H10K 59/1213; H10K 59/1216; H10K 59/131; H10K 59/353
See application file for complete search history.

(56) References Cited

FOREIGN PATENT DOCUMENTS

CN          111863929 A  * 10/2020  ......... H10K 59/1201

* cited by examiner

*Primary Examiner* — Antonio B Crite
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a plurality of sub-pixels, and a pixel drive circuit in the sub-pixel includes a drive transistor and a storage capacitor; the display substrate includes a semiconductor layer, a first conductive layer and a second conductive layer which are sequentially disposed on a substrate; the semiconductor layer at least includes an active layer of a drive transistor; the first conductive layer at least includes a first electrode plate; and the second conductive layer at least includes a second electrode plate and an electrode plate connection line, wherein the electrode plate connection line is connected to a second electrode plate in an adjacent sub-pixel in a first direction.

15 Claims, 14 Drawing Sheets

(51) Int. Cl.
*H10K 59/131* (2023.01)
*H10K 59/35* (2023.01)
*H10K 59/80* (2023.01)
*H10K 71/00* (2023.01)
(52) U.S. Cl.
CPC ......... *H10K 59/131* (2023.02); *H10K 59/353* (2023.02); *H10K 71/00* (2023.02)

DISPLAY SUBSTRATE, PREPARATION METHOD THEREOF, AND DISPLAY APPARATUS

TECHNICAL FIELD

The present disclosure relates to the field of display technology, and particularly relates to a display substrate and a preparation method thereof, and a display apparatus.

BACKGROUND

An Organic Light Emitting Diode (abbreviated as OLED) is an active light emitting display component, and has advantages of self-light-emission, wide viewing angle, high contrast, low power consumption, extremely high response speed, lightness and thinness, flexibility and low cost etc. With the continuous development of display technology, flexible display apparatuses which use OLEDs as light emitting devices and control signals by thin film transistors (TFTs) have become mainstream products in the current display field.

SUMMARY

The following is a summary of subject matter described in detail herein. This summary is not intended to limit the protection scope of the claims.

The invention provides a display substrate, in a plane parallel to the display substrate, the display substrate includes a plurality of sub-pixels, at least one sub-pixel includes a pixel drive circuit and a light emitting device connected to the pixel drive circuit, wherein the pixel drive circuit at least includes a drive transistor and a storage capacitor; in a plane perpendicular to the display substrate, the display substrate includes a semiconductor layer, a first conductive layer and a second conductive layer which are sequentially disposed on a substrate; the semiconductor layer at least includes an active layer of the drive transistor; the first conductive layer at least includes a first electrode plate of the storage capacitor, and the second conductive layer at least includes a second electrode plate of the storage capacitor and an electrode plate connection line; the electrode plate connection line is connected to a second electrode plate of an adjacent sub-pixel in a first direction; the first direction is a direction of a sub-pixel row;

an active layer of the drive transistor at least includes a channel region, and the channel region at least includes a first channel segment extending along the first direction and a second channel segment extending along a second direction, wherein the second direction is a direction of a sub-pixel column; the channel region has a second direction effective length in the second direction, and the second direction effective length is a length of the second channel segment in the second direction;

there is an overlap region between an orthographic projection of the electrode plate connection line on the substrate and an orthographic projection of the semiconductor layer on the substrate, and a distance between the overlap region and the channel region of the drive transistor is greater than or equal to the effective length in the second direction.

In an exemplary embodiment, an active layer of the drive transistor further includes a first region and a second region respectively connected to the channel region, and the semiconductor layer in the overlap region includes a second region of the drive transistor.

In an exemplary embodiment, a channel region of the drive transistor includes a first channel segment, a second channel segment, a third channel segment, a fourth channel segment and a fifth channel segment; a first end of the first channel segment is connected to the first region, and a second end of the first channel segment is connected to a first end of the second channel segment after extending along the first direction; a second end of the second channel segment is connected to the first end of the third channel segment after extending along an opposite direction of the second direction; a second end of the third channel segment is connected to a first end of the fourth channel segment after extending along the first direction; a second end of the fourth channel segment is connected to a first end of the fifth channel segment after extending along the second direction; and a second end of the fifth channel segment is connected to the second region after extending along the first direction;

a distance between the overlap region and the channel region of the drive transistor is a distance between an edge of the overlap region adjacent to the fifth channel segment in the second direction and an edge of the fifth channel segment adjacent to the overlap region in the second direction.

In an exemplary embodiment, a distance between the overlap region and the channel region of the drive transistor is greater than or equal to 1.5 μm.

In an exemplary embodiment, a distance between the overlap region and the channel region of the drive transistor is 1.6 μm to 4.5 μm.

In an exemplary embodiment, the pixel drive circuit further includes a third conductive layer, the third conductive at least includes a first power supply line, and the first power supply line is connected to the second electrode plate through a power via hole; a middle part of the second electrode plate is provided with an opening, and the power via hole is disposed between the opening and the overlap region.

In an exemplary embodiment, a distance between an edge of the power via hole adjacent to the opening in the first direction and an edge of the opening adjacent to the power via hole in the first direction is greater than or equal to a distance between an edge of the power via hole adjacent to the overlap region in the first direction and an edge of the overlap region adjacent to the power via hole in the first direction.

In an exemplary embodiment, a distance between an edge of the power via hole adjacent to the opening in the first direction and an edge of the opening adjacent to the power via hole in the first direction is greater than or equal to 0.85 μm.

In an exemplary embodiment a distance between an edge of the power via hole adjacent to the opening in the first direction and an edge of the opening adjacent to the power via hole in the first direction is 1.5 μm to 3.0 μm.

In an exemplary embodiment, a distance between an edge of the power via hole adjacent to the first the overlap region in the first region and an edge of the overlap region adjacent to the power via hole in the first direction is greater than or equal to 0.6 μm.

In an exemplary embodiment, a distance between an edge of the power via hole adjacent to the overlap region in the first direction and an edge of the overlap region adjacent to the power via hole in the first direction is 1.2 μm to 3.0 μm.

In an exemplary embodiment, conductivity of the second region of the drive transistor is greater than conductivity of the channel region of the drive transistor.

The present disclosure further provides a display apparatus, including the display substrate described above.

The present disclosure further provides a preparation method for a display substrate, in a plane parallel to the display substrate, the display substrate includes a plurality of sub-pixels, at least one sub-pixel includes a pixel drive circuit and a light emitting device connected to the pixel drive circuit, and the pixel drive circuit at least includes a drive transistor and a storage capacitor; the method includes:

sequentially forming a semiconductor layer, a first conductive layer and a second conductive layer on a substrate; the semiconductor layer at least includes an active layer of the drive transistor; the first conductive layer at least includes a first electrode plate of the storage capacitor, and the second conductive layer at least includes a second electrode plate of the storage capacitor and an electrode plate connection line; the electrode plate connection line is connected to a second electrode plate of adjacent sub-pixels in a first direction; and the first direction is a direction of a sub-pixel row;

an active layer of the drive transistor at least includes a channel region, and the channel region at least includes a first channel segment extending along the first direction and a second channel segment extending along a second direction, wherein the second direction is a direction of a sub-pixel column; the channel region has a second direction effective length in the second direction, and the second direction effective length is a length of the second channel segment in the second direction;

there is an overlap region between an orthographic projection of the electrode plate connection line on the substrate and an orthographic projection of the semiconductor layer on the substrate, and a distance between the overlap region and the channel region of the drive transistor is greater than or equal to the effective length in the second direction.

In an exemplary embodiment, the preparation method further includes:

forming a third conductive layer, wherein the third conductive layer at least includes a first power supply line, and the first power supply line is connected to the second electrode plate through a power via hole; The second electrode plate is provided with an opening, and the power via hole is arranged between the opening and the overlap region. The distance between the edge of the power via hole in the first direction adjacent to the opening and the edge of the opening in the first direction adjacent to the power via hole is greater than or equal to a distance between the edge of the power via hole in the first direction adjacent to the overlap region and the edge of the overlap region in the first direction adjacent to the power via hole.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain the technical solutions of the present disclosure and do not constitute a limitation on the technical solutions of the present disclosure.

Figure 1:
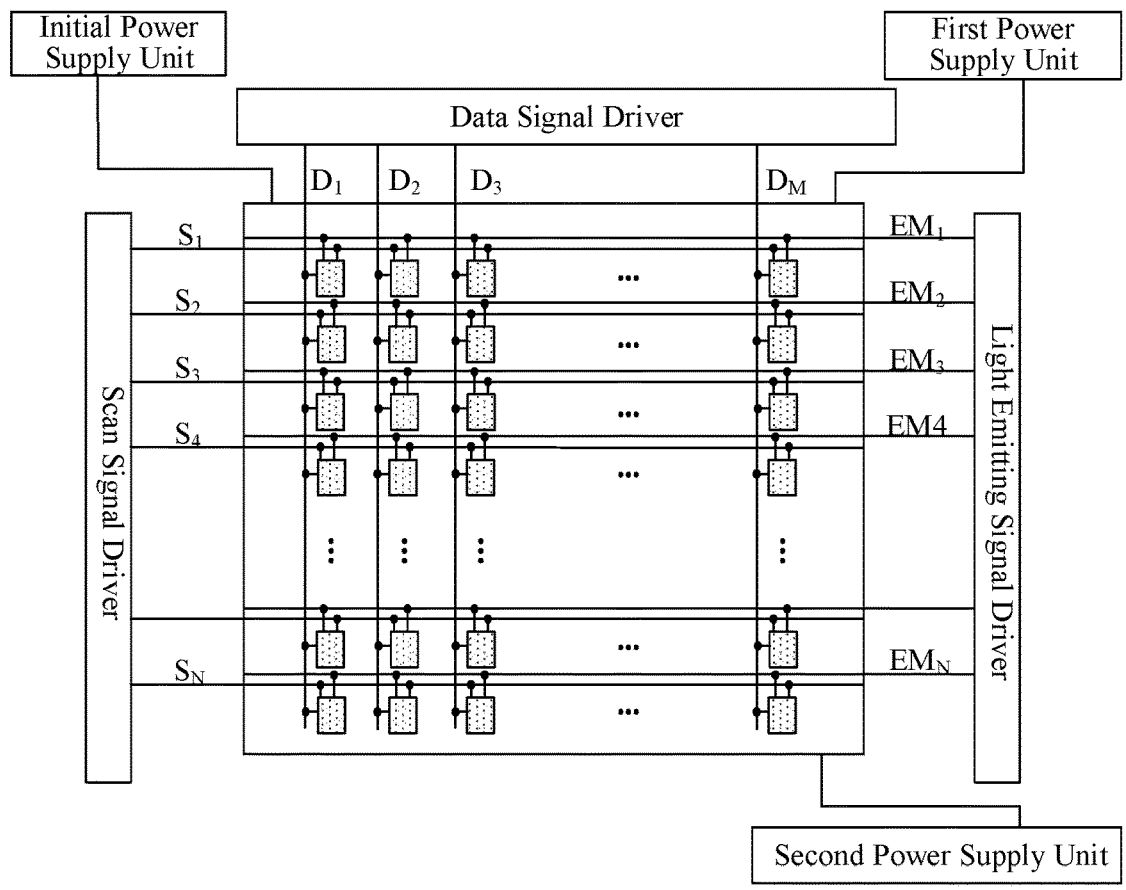
FIG. 1 is a schematic diagram of a structure of a display apparatus.

| Description of reference signs | | |
|---|---|---|
| 11 - first active layer; | 12 - second active layer; | 13 - third active layer; |
| 14 - fourth active layer; | 15 - fifth active layer; | 16 - sixth active layer; |
| 17 - seventh active layer; | 18 - channel region; | 21 - first scan signal line |
| 22 - second scan signal line | 23 - light emission control line; | 24 - first electrode plate; |
| 31 - initial signal line; | 32 - second electrode plate; | 33 - shield electrode; |
| 34 - opening; | 35 - electrode plate connection line; | 36 - overlap region; |
| 41 - first power supply line; | 42 - second electrode of the first transistor; | 43 - first electrode of the seventh transistor; |
| 44 - first electrode of the fourth transistor; | 45 - first electrode of the fifth transistor; | 46 - second electrode of the sixth transistor; |
| 51 - data signal line; | 52 - anode connection electrode; | 61 - first insulating layer; |
| 62 - second insulating layer; | 63 - third insulating layer; | 64 - fourth insulating layer; |
| 101 - substrate; | 102 - drive circuit layer; | 103 - light emitting device; |
| 104 - encapsulation | 301 - anode; | 302 - pixel define |

-continued

Description of reference signs

| layer; | | layer; |
| 303 - organic light emitting layer; | 304 - cathode; | 401 - first encapsulation layer; |
| 402 - second encapsulation layer; | 403 - third encapsulation layer. | |

DETAILED DESCRIPTION

To make the objects, technical solutions and advantages of the present disclosure more clear, embodiments of the present disclosure will be described in detail below with reference to the drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientation or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current can flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element with a certain electric action" is not particularly limited as long as it can transmit and receive electrical signals between the connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10° and below 10°, and thus also includes a case where the angle is above −5° and below 5°. In addition, "perpendicular" refers to a case where an angle formed by two straight lines is above −80° and below 100°, and thus also includes a case where the angle is above −85° and below 95°.

In this specification, "film" and "layer" may be interchangeable. For example, sometimes "conductive layer" may be replaced by "conductive film". Similarly, "insulating film" may sometimes be replaced by "insulating layer".

"About" in the present disclose means that limits of a value are not limited strictly, and the value is within a range of process and measurement errors.

FIG. 1 is a schematic diagram of a structure of a display apparatus. As shown in FIG. 1, the OLED display apparatus may include a scan signal driver, a data signal driver, an light emitting signal driver, an OLED display substrate, a first power supply unit, a second power supply unit and an initial power supply unit. In an exemplary embodiment, the OLED display substrate at least includes a plurality of scan signal lines (S1 to SN), a plurality of data signal lines (D1 to DM) and a plurality of light-emitting signal lines (EM1 to EMN); the scan signal driver is configured to sequentially supply scan signals to the plurality of scan signal lines (S1 to SN), the data signal driver is configured to supply data signals to the plurality of data signal lines (D1 to DM), and the light emitting signal driver is configured to sequentially supply light-emitting control signals to the plurality of light-emitting signal lines (EM1 to EMN). In an exemplary embodiment, a plurality of scan signal lines and a plurality of light-emitting signal lines extend along a horizontal direction. The display apparatus includes a plurality of sub-pixels, each sub-pixel includes a pixel drive circuit and a light emitting device, and the pixel drive circuit of one sub-pixel may be connected to a scan signal line, a light-emitting control line and a data signal line. The first power supply unit, the second power supply unit and the initial power supply unit are respectively configured to supply a first supply voltage, a second supply voltage and an initial supply voltage to the pixel drive circuit through a first power supply line, a second power supply line and an initial signal line.

Figure 2:
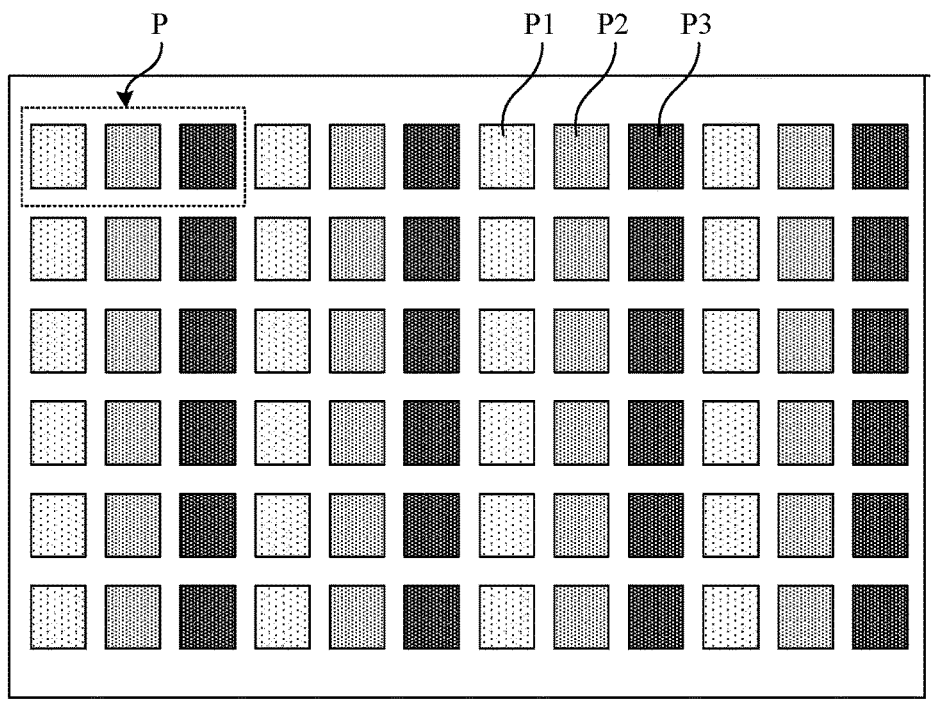
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and a light emitting device. The pixel drive circuits in the first sub-pixel P1, the second sub-pixel P2, and the third sub-pixel P3 are respectively connected to the scan signal line, the data signal line and the light-emitting signal line. The pixel drive circuit is configured to receive a data voltage transmitted by the data signal line and output a corresponding current to the light emitting device under a control of the scan signal line and the light-emitting signal line. The light emitting devices in the first sub-pixel P1, the second sub-pixel P2 and the third sub-pixel P3 are respectively connected to the pixel drive circuits of the sub-pixels where the light emitting devices are located. The light emitting device is configured to emit light with a corresponding brightness in response to a current output by the pixel drive circuit of the sub-pixel where the light emitting device is located.

In an exemplary embodiment, a pixel unit P may include red (R), green (G) and blue (B) sub-pixels, or may include red, green, blue and white (W) sub-pixels, which is not limited in the present disclosure. In an exemplary embodiment, a shape of a sub-pixel in a pixel unit may be rectangular, diamond, pentagonal or hexagonal. When a pixel unit includes three sub-pixels, the three sub-pixels may be arranged in a manner to stand side by side horizontally, in a manner to stand side by side vertically, or in a pyramid manner with two units sitting at the bottom and one unit placed on top. When a pixel unit includes four sub-pixels, the four sub-pixels may be arranged in a manner to stand side by side horizontally, in a manner to stand side by side vertically, or in a manner to form a square, which is not specifically limited in the present disclosure.

Figure 3:
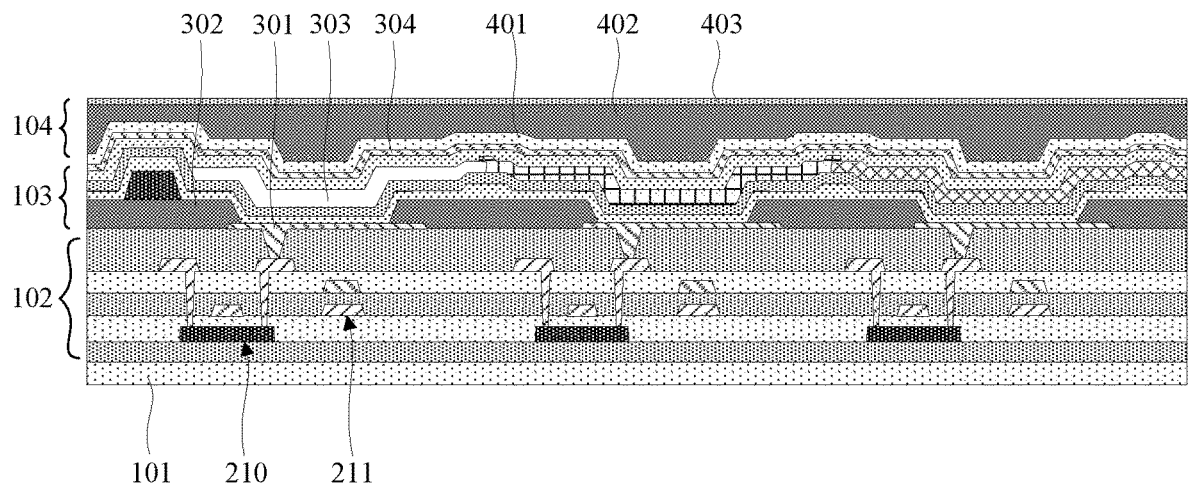
FIG. 3 is a schematic diagram of a sectional structure of a display substrate.

FIG. 3 is a schematic diagram of a sectional structure of a display substrate, showing a structure of three sub-pixels in an OLED display substrate. As shown in FIG. 3, on a direction perpendicular to the display substrate, the display substrate may include a drive circuit layer 102 disposed on a substrate 101, a light emitting device 103 disposed on a side of the drive circuit layer 102 away from the substrate 1, and an encapsulation layer 104 disposed on a side of the light emitting device 103 away from the substrate 1. In some possible implementations, a display substrate may include other film layers, such as post spacers, etc., which is not limited in the present disclosure.

In an exemplary embodiment, the drive circuit layer 102 of each sub-pixel may include a plurality of transistors and a storage capacitor forming a pixel drive circuit, an example of which is illustrated in FIG. 3 where each sub-pixel includes a drive transistor and a storage capacitor. In some possible implementations, the drive circuit layer 102 of each sub-pixel may include: a first insulating layer disposed on the substrate; an active layer disposed on the first insulating layer; a second insulating layer covering the active layer; a gate electrode and a first electrode plate arranged on the second insulating layer; a third insulating layer covering the gate electrode and the first electrode plate; a second electrode plate arranged on the third insulating layer; a fourth insulating layer covering the second electrode plate, via holes being provided in the second, third and fourth insulating layers exposing the active layer; a source electrode and a drain electrode arranged on the fourth insulating layer, the source electrode and the drain electrode being connected respectively to the active layer through the via holes; and a planarization layer covering the aforementioned structures, a via hole being provided in the flat layer exposing the drain electrode. The active layer, the gate electrode, the source electrode and the drain electrode form a drive transistor 210, and the first electrode plate and the second electrode plate form a storage capacitor 211.

In an exemplary embodiment, the light emitting device 103 may include an anode 301, a pixel define layer 302, an organic light emitting layer 303 and a cathode 304. The anode 301 is disposed on the planarization layer, and is connected to the drain electrode of the drive transistor through a via hole disposed on the planarization layer; the pixel define layer 302 is disposed on the anode 301 and the planarization layer, and the pixel define layer 302 is provided with a pixel opening exposing the anode 301; the organic light-emitting layer 303 is at least partially disposed in the pixel opening, and is connected to the anode 301; the cathode 304 is disposed on the organic light-emitting layer 303, and is connected to the organic light-emitting layer 303; and the organic light-emitting layer 303 emits light of corresponding colors under the drive of the anode 301 and the cathode 304.

In an exemplary embodiment, an encapsulation layer 104 may include a first encapsulation layer 401, a second encapsulation layer 402 and a third encapsulation layer 403 that are stacked together; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor may not enter into the light emitting device 103.

In an exemplary embodiment, an organic light emitting layer 303 may at least include a hole injection layer, a hole transport layer, a light emitting layer and a hole blocking layer which are stacked on the anode 301. In an exemplary embodiment, hole injection layers of all sub-pixels are integrated layers connected together, hole transport layers of all sub-pixels are integrated layers connected together, light emitting layers of adjacent sub-pixels may be slightly overlapped with each other or may be separate from each other, and hole blocking layers are integrated layers connected together.

Figure 4:
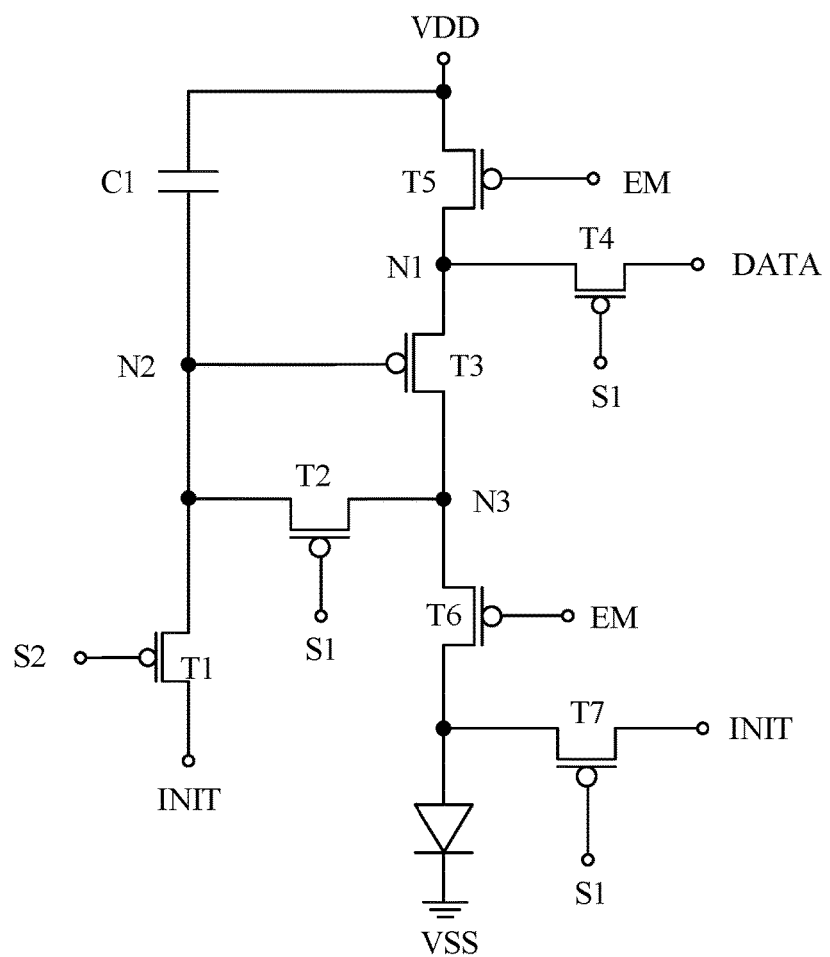
FIG. 4 is an equivalent circuit diagram of a pixel drive circuit.

In an exemplary implementation, a pixel drive circuit may have a structure of 3T1C, 4T1C, 5T1C, 5T2C, 6T1C or 7T1C. FIG. 4 is an equivalent circuit diagram of a pixel drive circuit. As shown in FIG. 4, the pixel drive circuit may include seven switch transistors (a first transistor T1 to a seventh transistor T7), one storage capacitor C and seven signal lines (a data signal line DATA, a first scan signal line S1, a second scan signal line S2, an initial signal line INIT, a first power supply line VDD, a second power supply line VSS and a light emitting signal line EM).

In an exemplary embodiment, a gate electrode of the first transistor T1 is connected to the second scan signal line S2, a first electrode of the first transistor T1 is connected to the initial signal line INIT, and a second electrode of the first transistor is connected to a second node N2. A gate electrode of the second transistor T2 is connected to the first scan signal line S1, a first electrode of the second transistor T2 is connected to the second node N2, and a second electrode of the second transistor T2 is connected to a third node N3. A gate electrode of the third transistor T3 is connected to the second node N2, a first electrode of the third transistor T3 is connected to a first node N1, and a second electrode of the third transistor T3 is connected to the third node N3. A gate electrode of the fourth transistor T4 is connected to the first scan signal line S1, a first electrode of the fourth transistor T4 is connected to the data signal line DATA, and a second electrode of the fourth transistor T4 is connected to the first node N1. A gate electrode of the fifth transistor T5 is connected to the light emitting signal line EM, a first electrode of the fifth transistor T5 is connected to the first power supply line VDD, and a second electrode of the fifth transistor T5 is connected to the first node N1. A gate electrode of the sixth transistor T6 is connected to the light emitting signal line EM, a first electrode of the sixth transistor T6 is connected to the third node N3, and a second electrode of the sixth transistor T6 is connected to a first electrode of the light emitting device. A gate electrode of the seventh transistor T7 is connected to the first scan signal line S1, a first electrode of the seventh transistor T7 is connected to the initial signal line INIT, and a second electrode of the seventh transistor T7 is connected to the first electrode of the light emitting device. A first terminal of the storage capacitor C is connected to the second power supply line VDD, and a second terminal of the storage capacitor C is connected to the second node N2.

In an exemplary implementation, the first transistor T1 to the seventh transistor T7 may be P-type transistors or may be N-type transistors. Adopting transistors of the same type in the pixel drive circuit may simplify a process flow, reduce difficulty in a preparation process of the display panel, and improve a product yield rate. In some possible implementations, the first transistor T1 to the seventh transistor T7 may include P-type transistors and N-type transistors.

In an exemplary embodiment, a second electrode of the light emitting device is connected to the second power line VSS, a signal of the second power line VSS is a low level signal and a signal of the first power line VDD continuously provides a high-level signal. The first scan signal line S1 is a scan signal line in a pixel drive circuit in the present display row, and the second scan signal line S2 is a scan signal line in a pixel drive circuit in a previous display row, that is, for an nth display row, the first scan signal line S1 is S(n), the second scan signal line S2 is S(n−1), the second scan signal line S2 in the present display row and the first scan signal line S1 in the pixel drive circuit in the previous display row may be a same signal line, so as to reduce signal lines of the display panel and implement a narrow bezel of the display panel.

In an exemplary embodiment, the first scan signal line S1, the second scan signal line S2, the light emitting signal line EM, the initial signal line INIT extend along a horizontal direction, and the second power supply line VSS, the first power supply line VDD and the data signal line DATA extend along a vertical direction.

In an exemplary implementation, the light emitting device may be an organic light emitting diode (OLED), which includes a first electrode (an anode), an organic light emitting layer and a second electrode (a cathode) that are stacked.

Figure 5:
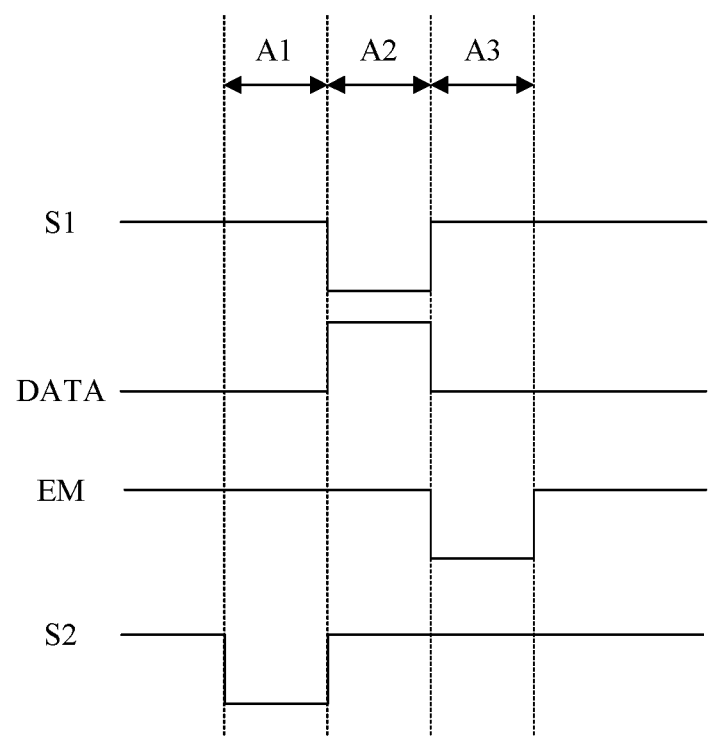
FIG. 5 is a working time sequence diagram of a pixel drive circuit.

FIG. 5 is a working time sequence diagram of a pixel drive circuit. An exemplary embodiment of the present disclosure will be described below through a working process of the pixel drive circuit shown in FIG. 4. The pixel drive circuit in FIG. 4 includes seven transistors (the first transistor T1 to the sixth transistor T7), a storage capacitor C and seven signal lines (the data signal line DATA, the first scan signal line S1, the second scan signal line S2, the initial signal line INIT, the first power supply line VDD, the second power supply line VSS and the light emitting signal line EM). All of the seven transistors are P-type transistors.

In an exemplary embodiment, a working process of the pixel drive circuit may include the following stages.

In a first stage A1, referred to as a reset stage, a signal of the second scan signal line S2 is a low level signal, and a signal of the first scan signal line S1 and a signal of the light emitting signal line EM are high level signals. The signal of the second scan signal line S2 is a low level signal, to make the first transistor T1 on, and a signal of the initial signal line INIT is provided to the second node N2 to initialize the storage capacitor C, and clean up an original data voltage in the storage capacitor. The signals of the first scan signal line S1 and the light emitting signal line EM are high level signals, making the second transistor T2, the fourth transistor T4, the fifth transistor T5, the sixth transistor T6 and the seventh transistor T7 off. The OLED does not emit light during this stage.

In a second stage A2, referred to as a data writing stage or a threshold compensation stage, the signal of the first scan signal line S1 is a low level signal, the signals of the second scan signal line S2 and the light emitting signal line EM are high level signals, and the data signal line DATA outputs a data voltage. During this stage, because the second terminal of the storage capacitor C is at a low level, the third transistor T3 is turned on. The signal of the first scan signal line S1 is a low level signal, making the second transistor T2, the fourth transistor T4 and the seventh transistor T7 on. The second transistor T2 and the fourth transistor T4 are turned on, so that a data voltage output by the data signal line DATA is provided to the second node N2 through the first node N1, the turned-on third transistor T3, the third node N3 and the turned-on second transistor T2. Then, a voltage difference value between the data voltage output by the data signal line DATA and a threshold voltage of the third transistor T3 is charged into the storage capacitor C. A voltage of the second terminal (the second node N2) of the storage capacitor C is Vdata−|Vth|, Vdata is the data voltage output by the data signal line DATA, and Vth is the threshold voltage of the third transistor T3. The seventh transistor T7 is turned on, so that an initial voltage of the initial signal line INIT is provided to a first electrode of the OLED to initialize (reset) the first electrode of the OLED and clean up a pre-stored internal voltage therein, thus the initialization is completed to ensure that the OLED does not emit light. The signal of the second scan signal line S2 is a high level signal, making the first transistor T1 off. The signal of the light emitting signal line EM is a high level signal, making the fifth transistor T5 and the sixth transistor T6 off.

In a third stage A3, referred to as a light emitting stage, the signal of the light emitting signal line EM is a low level signal, and the signals of the first scan signal line S1 and the second scan signal line S2 are high level signals. The signal of the light emitting signal line EM is a low level signal, making the fifth transistor T5 and the sixth transistor T6 on. A supply voltage output by the first power supply line VDD provides a drive voltage to the first electrode of the OLED through the turned-on fifth transistor T5, third transistor T3 and sixth transistor T6, to drive the OLED to emit light.

In a drive process of the pixel drive circuit, a drive current flowing through the third transistor T3 (a drive transistor) is determined based on a voltage difference between its gate electrode and first electrode. Since a voltage of the second node N2 is Vdata−|Vth|, the drive current of the third transistor T3 is:

$$I=K*(Vgs-Vth)2=K*[(Vdd-Vdata+|Vth|)-Vth]2=K*[(Vdd-Vdata]2$$

wherein, I is a drive current flowing through the third transistor T3, that is, a drive current that drives the OLED to emit light, K is a constant, Vgs is a voltage difference between the gate electrode and the first electrode of the third transistor T3, Vth is a threshold voltage of the third transistor T3, Vdata is a data voltage output by the data signal line DATA, and Vdd is a supply voltage output by the first power supply line VDD.

Figure 6:
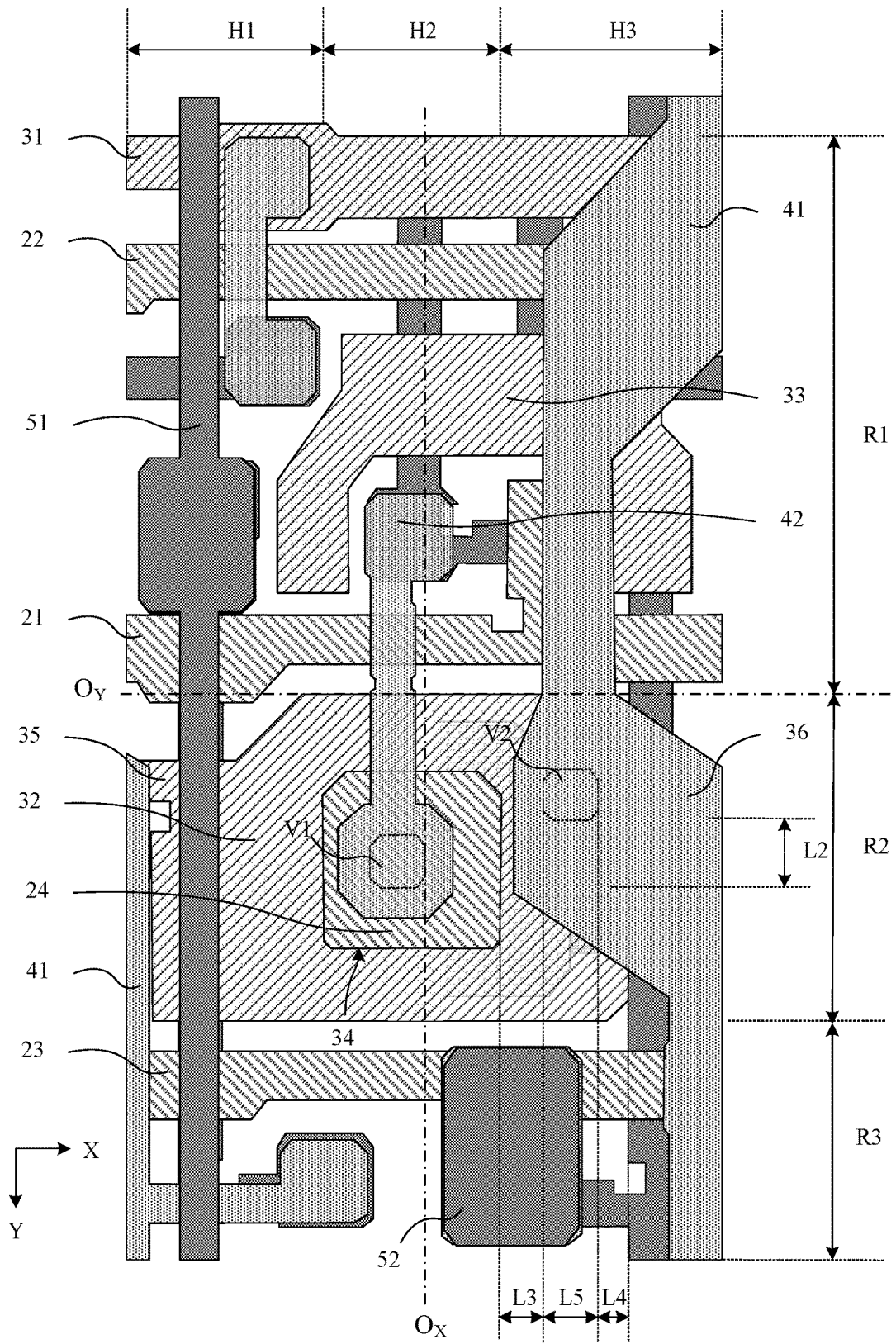
FIG. 6 is a schematic diagram of a structure of a display substrate according to an exemplary embodiment of the present disclosure.

FIG. 6 is a schematic structure diagram of a display substrate according to an exemplary embodiment of the present disclosure, which shows a planar structure of a sub-pixel. As shown in FIG. 6, in a direction parallel to the display substrate, sub-pixels of the display substrate are provided with a first scan signal line 21, a second scan signal line 22, a light emission control line 23, an initial signal line 31, a first power supply line 41, a data signal line 51, a pixel drive circuit and a light emitting device, and the pixel drive circuit may include a plurality of transistors, storage capacitors, electrode plate connection lines 35 and anode connection electrodes 52. The plurality of transistors at least include a drive transistor (third transistor), the third transistor includes an active layer, a gate electrode, a first electrode and a second electrode, the active layer of the third transistor includes a channel region, a first region and a second region 13-2, and the storage capacitor includes a first electrode plate 24 and a second electrode plate 32.

In a direction perpendicular to the display substrate, the display substrate may include a semiconductor layer, a first conductive layer, a second conductive layer, a third conductive layer and a fourth conductive layer which are disposed sequentially on the substrate. In an exemplary embodiment, the semiconductor layer may include active layers of a plurality of transistors, and the active layer of the third transistor includes a channel region, a first region and a second region 13-2; the first conductive layer may include a first scan signal line 21, a second scan signal line 22, a light emission control line 23, a first electrode plate 24 of a storage capacitor and gate electrodes of a plurality of transistors. The second conductive layer may include an initial signal line 31, a second electrode plate 32 of a storage capacitor, a shield electrode 33 and a electrode plate connection line 35. The third conductive layer may include a first power supply line 41 and first and second electrodes of a plurality of transistors; the fourth conductive layer may include a data signal line 51 and an anode connection electrode 52.

In an exemplary embodiment, the display substrate may further include a first insulating layer, a second insulating layer, a third insulating layer, a fourth insulating layer and a fifth insulating layer. The first insulating layer is disposed between the substrate and the semiconductor layer, the second insulating layer is disposed between the semiconductor layer and the first conductive layer, the third insulating layer is disposed between the first and second conductive layers, the fourth insulating layer is disposed between the second and third conductive layers, and the fifth insulating layer is disposed between the third and fourth conductive layers.

In an exemplary embodiment, the sub-pixel has a first center line OX and a second center line OY. The first center line OX is a centerline dividing sub-pixel evenly in a first direction X, and the first center line OX extends along a second direction Y. The second centerline OY is a centerline dividing sub-pixel evenly in the second direction Y, and the second centerline OY extends along the first direction X. In an exemplary embodiment, the first direction X may be a direction of sub-pixel rows (a horizontal direction), and the second direction Y may be a direction of sub-pixel columns (a vertical direction).

In an exemplary embodiment, along the first direction X, the sub-pixel may be divided into a horizontal first region H1, a horizontal second region H2 and a horizontal third region H3, that is, the horizontal first region H1 is located on one side of the first center line OX, the horizontal third region H3 is located on the other side of the first center line OX, and the horizontal second region H2 is located between the horizontal first region H1 and the horizontal third region H3. In an exemplary embodiment, a first length of the horizontal first region H1 may be greater than or equal to a first length of the horizontal second region H2, and a first length of the horizontal third region H3 may be greater than or equal to the first length of the horizontal second region H2. In the exemplary embodiment of the present disclosure, a first length refers to a dimension in the first direction X.

In an exemplary embodiment, along the second direction Y, sub-pixels may be divided into a longitudinal first region R1, a longitudinal second region R2 and a longitudinal third region R3, and the longitudinal second region R2 is located between the longitudinal first region R1 and the longitudinal third region R3. In an exemplary embodiment, a second length of the longitudinal first region R1 may be greater than a second length of the longitudinal second region R2, and the second length of the longitudinal second region R2 may be greater than a second length of the longitudinal third region R3. In the exemplary embodiment of the present disclosure, a second length refers to a dimension in the second direction Y.

In an exemplary embodiment, a sum of the second length of the second longitudinal region R2 and the second length of the third longitudinal region R3 may be equal to the second length of the first longitudinal region R1, that is, the first longitudinal region R1 is located on one side of the second center line OY, the second longitudinal region R2 is located on the other side of the second centerline OY, and the third longitudinal region R3 is located on a side of the second longitudinal region R2 away from the first longitudinal region R1.

In an exemplary embodiment, a main body portion of the data signal line 51 extending along the second direction Y is located in the horizontal first region H1, and a main body portion of the first power supply line 41 extending along the second direction Y is located in the horizontal third region H3.

In an exemplary embodiment, the first scan signal line 21, the second scan signal line 22 and the initial signal line 31 extending along the first direction X are located in the longitudinal first region R1, the first and second electrode plates 24 and 32 are located in the longitudinal second region R2, and the light emission control line 23 extending along the first direction X is located in the longitudinal third region R3. In an exemplary embodiment, the first electrode plate 24 and the second electrode plate 32 form a storage capacitor of the pixel drive circuit.

In an exemplary embodiment, a plurality of transistors of the pixel drive circuit may include first to seventh transistors. A gate electrode of the first transistor is connected to the second scan signal line 22, a first electrode of the first transistor is connected to the initial signal line 31, and a second electrode of the first transistor is connected to a first electrode of the second transistor, a gate electrode of the third transistor and the first electrode plate 24 respectively. A gate electrode of the second transistor is connected to the first scan signal line 21, and a second electrode of the second transistor is connected to a second electrode of the third transistor and a first electrode of the sixth transistor respectively. A first electrode of the third transistor is connected to a second electrode of the fourth transistor and a second electrode of the fifth transistor respectively. A gate electrode of the fourth transistor is connected to the first scan signal line 21, and a first electrode of the fourth transistor is connected to the data signal line 51. A gate electrode of the fifth transistor is connected to a light emitting signal line 23, and a first electrode of the fifth transistor is connected to first power supply line 41 and the second electrode plate 32 respectively. A gate electrode of the sixth transistor is connected to the light emitting signal line 23, and a second electrode of the sixth transistor is connected to a second electrode of the seventh transistor T7 and a first electrode of the light emitting device respectively. A gate electrode of the seventh transistor is connected to the first scan signal line 21, a first electrode of the seventh transistor is connected to the initial signal line 31, and a second electrode of the seventh transistor is connected to the second electrode of the sixth transistor and the first electrode of the light emitting device respectively.

In an exemplary embodiment, the third insulating layer and the fourth insulating layer covering the first electrode plate 24 are provided with a first via hole V1, and a second electrode 42 of the first transistor is connected to the first electrode plate 24 through the first via hole V1.

In an exemplary embodiment, the fourth insulating layer covering the second electrode plate 32 are provided with a second via hole V2, and the first power supply line 41 is connected to the second electrode plate 32 through the second via hole V2.

In an exemplary embodiment, the second region 13-2 of the third active layer is disposed in a semiconductor layer, and its first terminal is connected to a channel region of the third transistor (a drive transistor), a second terminal is connected to an active layer of the second transistor, and a third terminal is connected to an active layer of the sixth transistor.

In an exemplary embodiment, the electrode plate connection line 35 is disposed in the second conductive layer. The electrode plate connection line 35 is straight and parallel to the first direction X. A first end of the electrode plate connection line 35 is connected to the second electrode plate 32 of the present sub-pixel, and a second end extends along the first direction X or an opposite direction of the first direction X, and is connected to the second electrode plate 32 of an adjacent sub-pixel.

In an exemplary embodiment, the second electrode plate 32 is provided with an opening 34, the opening 34 is located in the horizontal second region H2, and an orthographic projection of the opening 34 on the substrate includes an orthographic projection of the first via hole V1 on the substrate.

As shown in FIG. 6 in conjunction with FIGS. 7 to 9D, there is an overlap region 36 between an orthographic projection of the semiconductor layer (the second region 13-2 of the third active layer) and an orthographic projection of the electrode plate connection line 35 on the substrate, and a distance L2 between the overlap region 36 and a channel region of the third transistor may be greater than or equal to an effective length of the channel region of the third transistor in the second direction. The third transistor is a drive transistor, and an active layer of the third transistor at least includes a channel region which at least includes a first channel segment extending along the first direction X and a second channel segment extending along the second direction Y, and an effective length of the second direction is a length of the second channel segment in the second direction Y.

In an exemplary embodiment, a distance L2 may be greater than or equal to 1.5 μm. In some possible implementations, a distance L2 may approximately be 1.6 μm to 4.5 μm. In other possible implementations, a distance L2 may approximately be 2.5 μm to 4.5 μm.

According to the display substrate provided by the exemplary embodiment of the present disclosure, by setting a distance between the overlap region and the channel region of the third transistor, an impact of overlapping capacitance on the data signal transmitted by the third transistor is effectively reduced, loading and power consumption are reduced, and a display effect is improved.

In an exemplary embodiment, a distance L3 between an edge of the second via hole V2 adjacent to the opening 34 and an edge of the opening 34 adjacent to the second via hole V2 may be greater than or equal to a distance L4 between an edge of the second via hole V2 adjacent to the overlap region 36 and an edge of the overlap region 36 adjacent to the second via hole V2.

In an exemplary embodiment, a distance L3 may be greater than or equal to 0.85 μm. In some possible implementations, a distance L3 may approximately be 1.5 μm to 3.0 μm. In other possible implementations, a distance L3 may approximately be 2.0 μm to 3.0 μm.

In an exemplary embodiment, a distance L4 may be greater than or equal to 0.6 μm. In some possible implementations, a distance L4 may approximately be 1.2 μm to 3.0 μm. In other possible implementations, a distance L4 may approximately be 2.0 μm to 3.0 μm.

According to the display substrate provided by the exemplary embodiment of the present disclosure, by setting the distance between the second via hole and the opening and the distance between the second via hole and the overlap region, a process margin is improved, a short circuit is avoided, and a yield is improved.

The following is an exemplary explanation through a preparation process of the display substrate. The "patterning process" described in the present disclosure includes treatments such as photoresist coating, mask exposure, development, etching and photoresist stripping for metal materials, inorganic materials or transparent conductive materials, and includes treatments such as organic material coating, mask exposure and development for organic materials. Deposition may include any one or more of sputtering, vapor deposition and chemical vapor deposition, coating may include any one or more of spraying coating, spin coating and ink-jet printing, and etching may include any one or more of dry etching and wet etching, which are not limited in the present disclosure. A "thin film" refers to a layer of thin film manufactured by a certain material on a substrate using deposition, coating or other processes. If the "thin film" does not need the patterning process throughout the manufacturing process, the "thin film" may be called a "film". If the "thin film" needs the patterning process throughout the manufacturing process, it is called a "thin film" before the patterning process, and called a "layer" after the patterning process. The "layer" after the patterning process contains at least one "pattern". "A and B are disposed on a same layer" mentioned in the present disclosure refers that A and B are formed at the same time by a same patterning process, and the "thickness" of a film is a dimension of the film in a direction perpendicular to the display substrate. In an exemplary embodiment of the present disclosure, "an orthographic projection of B is within a range of an orthographic projection of A" refers that a boundary of an orthographic projection of B falls within a boundary of an orthographic projection of A, or the boundary of the orthographic projection of A is overlapped with the boundary of the orthographic projection of B. "An orthographic projection of A including an orthographic projection of B" means that a boundary of the orthographic projection of B falls within a range of boundary of the orthographic projection of A, or the boundary of the orthographic projection of A is overlapped with the boundary of the orthographic projection of B.

Figure 7:
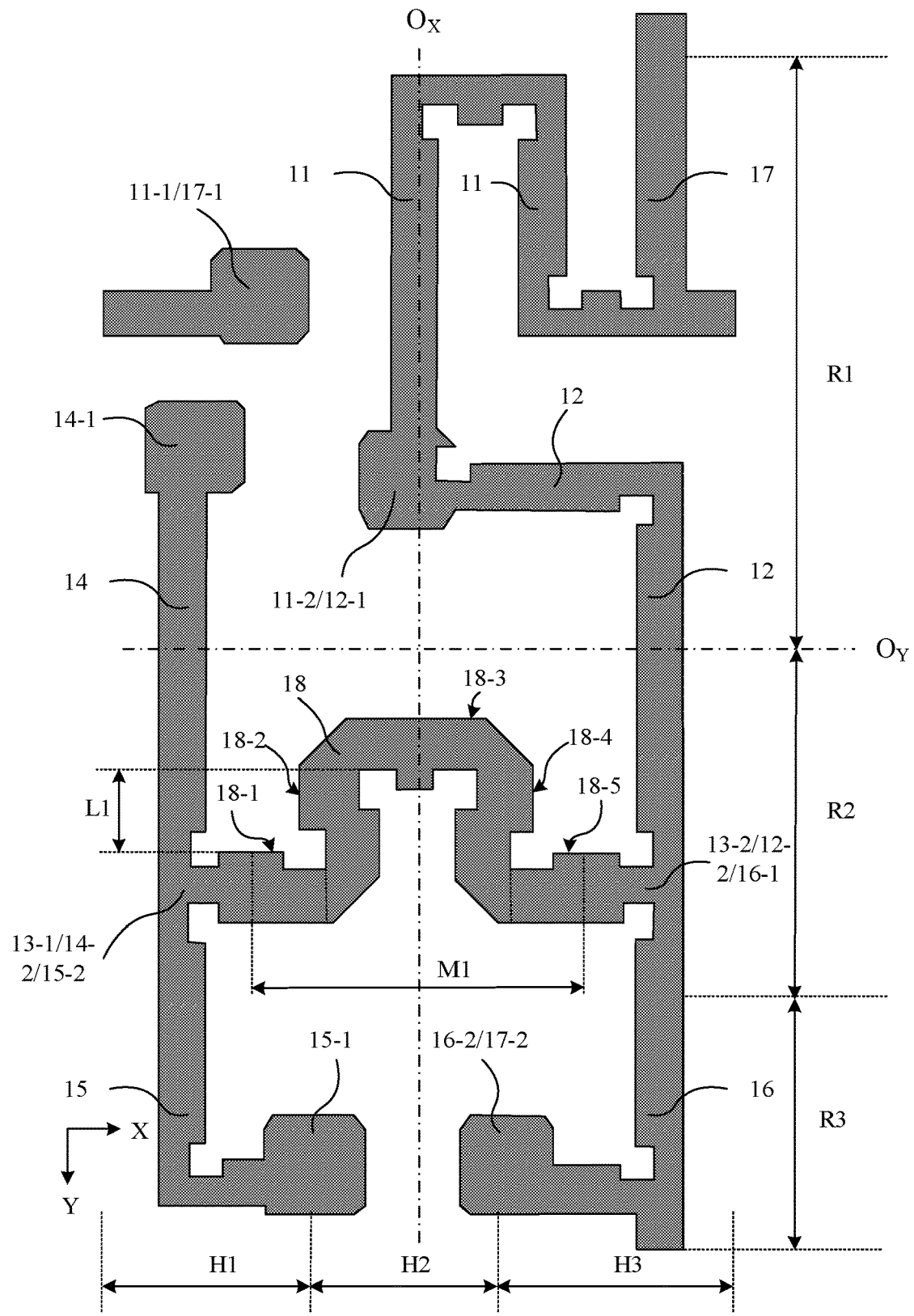
FIG. 7 is a schematic diagram after a pattern of a semiconductor layer is formed according to an exemplary embodiment of the present disclosure.

In an exemplary embodiment, the preparation process of the display substrate may include the following operations:

(1) A pattern of a semiconductor layer is formed. In an exemplary embodiment, forming a pattern of a semiconductor layer may include: depositing a first insulating film and a semiconductor film in sequence on the substrate, patterning the semiconductor film through the patterning process to form a first insulating layer covering the substrate and disposing a semiconductor layer on the first insulating layer, as shown in FIG. 7.

In an exemplary embodiment, a semiconductor layer of each sub-pixel may include a first active layer of the first transistor T1 to a seventh active layer of the seventh transistor T7, and the first active layer of the first transistor T1 to the seventh active layer of the seven-transistor T7 is an integral structure connected to each other.

In an exemplary embodiment, the first active layer 11 of the first transistor T1, the second active layer 12 of the second transistor T2, the fourth active layer 14 of the fourth transistor T4 and the seventh active layer 17 of the seventh transistor T7 are disposed in the longitudinal first region R1, the third active layer 13 of the third transistor T3 is disposed in the longitudinal second region R2, and the fifth active layer 15 of the fifth transistor T5 and the sixth active layer 16 of the sixth transistor T6 are disposed in the longitudinal third region R3. The first active layer 11 and the seventh active layer 17 are disposed at a side in the longitudinal first region R1 away from the longitudinal second region R2, and the second active layer 12 and the fourth active layer 14 are disposed at a side in the longitudinal first region R1 adjacent to the longitudinal second region R2.

In an exemplary embodiment, the first active layer 11 is in a shape of an "n", the seventh active layer 17 is in a shape of an "L", and the seventh active layer 17 is located on a side of the first active layer 11 away from the first center line OX. The second active layer 12 is in a shape of a "7" and located in the horizontal third region H3. The fourth active layer 14 is in a shape of a "1" and is located in the horizontal first region H1. The third active layer 13 is in a shape of a "Ω", which may be mirror-symmetrical with respect to the first center line OX. The fifth active layer 15 is in a shape of an "L" and located in the first horizontal region H1, and the sixth active layer 16 is located in the third horizontal region H3. A shape of the sixth active layer 16 and a shape of the fifth active layer 15 may be mirror-symmetrical with respect to the first center line OX.

In an exemplary embodiment, the active layer of each transistor includes a first region, a second region, and a channel region located between the first region and the second region. In an exemplary embodiment, a first region 11-1 of the first active layer 11 also serves as a first region 17-1 of the seventh active layer 17; a second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a second region 16-2 of the sixth active layer 16 also serves as a second region 17-2 of the seventh active layer 17.

In an exemplary embodiment, the third active layer 13 of the third transistor includes a first region 13-1, a second region 13-2 and a channel region 18. The first region 13-1 of the third active layer 13 also serves as a second region 14-2 of the fourth active layer 14 and a second region 15-2 of the fifth active layer 15, that is, the first region 13-1 of the third active layer 13, the second region 14-2 of the fourth active layer 14 and the second region 15-2 of the fifth active layer 15 are connected to each other. The second region 13-2 of the third active layer 13 also serves as the second region 12-2 of the second active layer 12 and the first region 16-1 of the sixth active layer 16, that is, the second region 13-2 of the third active layer 13, the second region 12-2 of the second active layer 12 and the first region 16-1 of the sixth active layer 16 are connected to each other. A channel region 18 of the third active layer 13 is disposed between the first region 13-1 and the second region 13-2, and both ends of the channel region 18 are respectively connected to the first region 13-1 and the second region 13-2.

In an exemplary embodiment, the channel region 18 includes a first channel segment 18-1, a third channel segment 18-3 and a fifth channel segment 18-5 extending along a first direction X, and a second channel segment 18-2 and a fourth channel segment 18-4 extending along a second direction Y. A first end of the first channel segment 18-1 is connected to the first region 13-1, and a second end is connected to a first end of the second channel segment 18-2 after extending along the first direction X. The first end of the second channel segment 18-2 is connected to the second end of the first channel segment 18-1, and the second end is connected to a first end of the third channel segment 18-3 after extending in an opposite direction of the second direction Y. The first end of the third channel segment 18-3 is connected to a second end of the second channel segment 18-2, and the second end is connected to a first end of the fourth channel segment 18-4 after extending along the first direction X. The first end of the fourth channel segment 18-4 is connected to a second end of the third channel segment 18-3, and the second end is connected to a first end of the fifth channel segment 18-5 after extending along the second direction Y. The first end of the fifth channel segment 18-5 is connected to a second end of the fourth channel segment 18-4, and the second end extends along the first direction X and then is connected to the second region 13-2 to form a channel region 18 in an Ω shape.

In an exemplary embodiment, the channel region 18 has a first direction length M1 in the first direction X, which is a distance between a first end of the first channel segment 18-1 and a second end of the fifth channel segment 18-5, that is, a sum of extension lengths of the first channel segment 18-1, the third channel segment 18-3 and the fifth channel segment 18-5 along the first direction X.

In an exemplary embodiment, the channel region 18 has a second direction effective length L1 in the second direction Y, which is a distance between the first end of the second channel segment 18-2 and the second end of the second channel segment 18-2, that is, a length of the second end of the second channel segment extending along the second direction Y to the first end of the second channel segment, or a distance between the first end of the fourth channel segment 18-4 and the second end of the fourth channel segment 18-4, that is, a length of the first end of the fourth channel segment extending along the second direction Y to the second end of the fourth channel segment.

A channel refers to a semiconductor layer between a first region and a second region in an active layer of a transistor. A channel width-to-length ratio is a ratio of a channel width to a channel length, which is an important parameter of a transistor. When channel lengths are the same, the greater the channel width is, the faster the speed is and the greater the power consumption is. When channel widths are the same, the shorter the channel length is, the faster the speed is and the greater the power consumption is. In order to increase a channel length, the channel region 18 is arranged in an "Ω" shape. A channel length shown in FIG. 7 is M1+2*L1, and an effective length L1 in the second direction affects the channel length value and the channel width-length ratio.

In an exemplary embodiment, in the second stage of the operation of the pixel drive circuit, a low-level signal output by the first scan signal line S1 turns on the second transistor, the fourth transistor and the seventh transistor, while a first electrode plate of the storage capacitor is at a low level to turn on the third transistor, therefore, a data voltage output by the data signal lines respectively passes through the first region 14-1 of the fourth active layer 14, the first region 13-1 of the third active layer 13 (i.e., the second region 14-2 of the fourth active layer 14), the channel region 18 of the third active layer 13, the second region 13-2 of the third active layer 13 (i.e., the second region 12-2 of the second active layer 12), and the first region 12-1 of the second active layer 12, making a difference between the data voltage output by the data signal line and the threshold voltage of the third transistor T3 charged into the first electrode plate of the storage capacitor. Because the second region 13-2 of the third active layer 13 is overlapped with an electrode plate connection line of the storage capacitor subsequently formed, the second region 13-2 of the third active layer 13 transmits data signals and the electrode plate connection line transmits power signals, and thus the second region 13-2 of the third active layer 13 forms overlapping capacitance with the electrode plate connection line. The research shows that the overlapping capacitance will affect the transmission of data signals by the third transistor, which will increase loads and power consumptions of the pixel drive circuit and make display effects worse.

Figure 8:
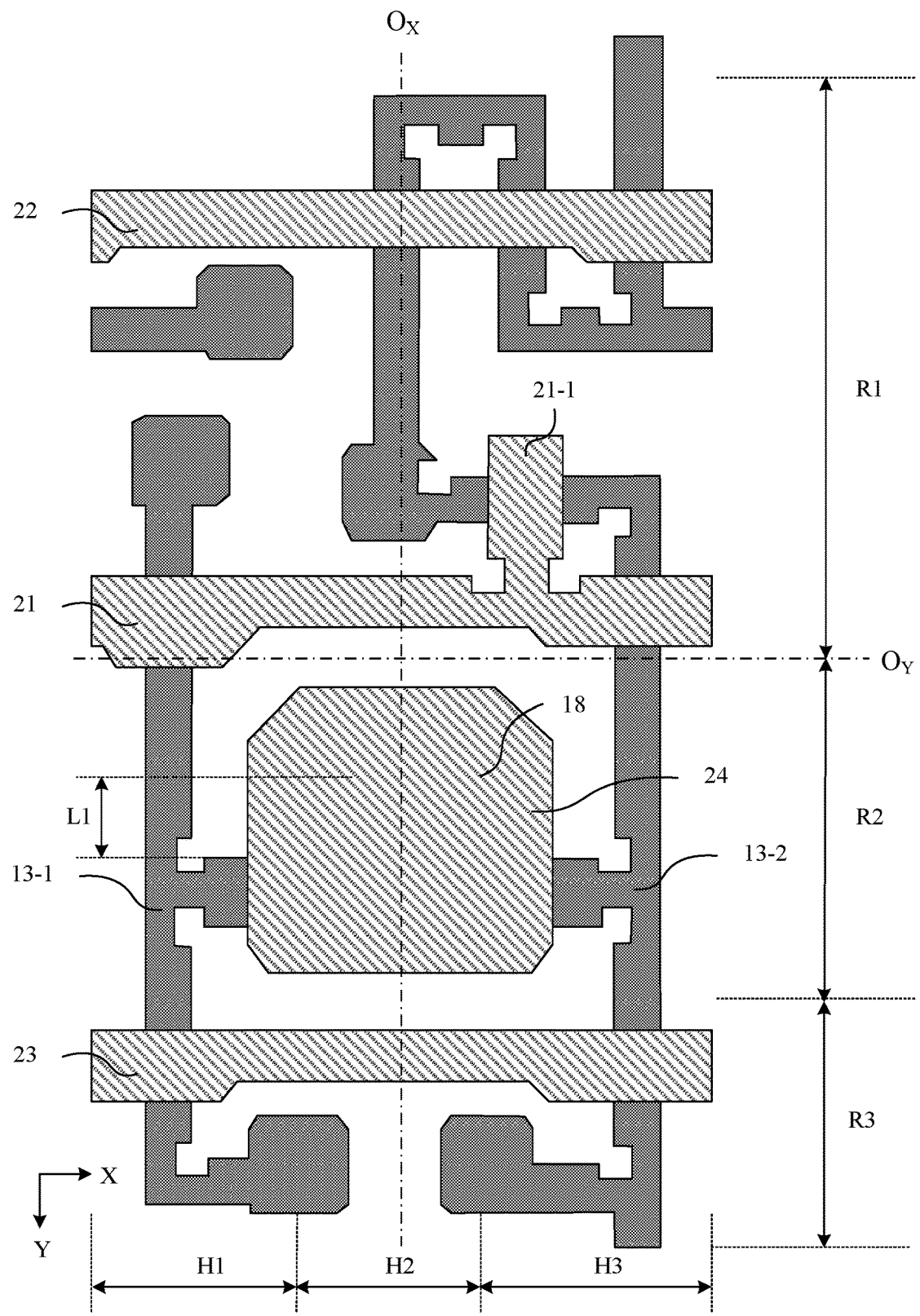
FIG. 8 is a schematic diagram after a pattern of a first conductive layer is formed according to an exemplary embodiment of the present disclosure.

(2) A pattern of a first conductive layer is formed. In an exemplary embodiment, forming a pattern of a first conductive layer may include: depositing a second insulating film and a first metal film in sequence on the substrate on which the aforementioned patterns are formed, and patterning the first metal film through the patterning process to form a second insulating layer covering the pattern of the semiconductor layer and disposing the pattern of the first conductive layer on the second insulating layer. The pattern of the first conductive layer includes the first scan signal line 21, the second scan signal 22, the light emission control line 23 and the first electrode plate 24 of the storage capacitor, as shown in FIG. 8.

In an exemplary embodiment, the first scan signal line 21, the second scan signal line 22, and the light emission control line 23 extend along the first direction X. The first scan signal line 21 and the second scan signal line 22 are disposed in the longitudinal first region R1, the second scan signal line 22 is located on a side of the first scan signal line 21 away from the longitudinal second region R2, the light emission control line 23 is disposed in the longitudinal third region R3, and the first electrode plate 24 of the storage capacitor is disposed in the longitudinal second region R2 between the first scan signal line 21 and the light emission control line 23.

In an exemplary embodiment, the first electrode plate 24 may be rectangular, and rectangle corners may be arranged with chamfer. There is an overlap region between an orthographic projection of the first electrode plate 24 on the substrate and an orthographic projection of the third active layer of the third transistor T3 on the substrate. In an exemplary embodiment, the first electrode plate 24 also serves as a gate electrode of the third transistor T3.

In an exemplary embodiment, the first scan signal line 21 may be arranged with unequal widths, and a width of the first scan signal line 21 is a dimension of the first scan signal line 21 in the second direction Y. The first scan signal line 21 includes an region overlapping the semiconductor layer and an region not overlapping the semiconductor layer. A width of the first scan signal line 21 of the region overlapping the semiconductor layer may be larger than a width of the first scan signal line 21 of the region not overlapping the semiconductor layer.

In an exemplary embodiment, the first scan signal line 21 is provided with a gate block 21-1 protruding to the second scan signal line 22, and there is an overlap region between an orthographic projection of the gate block 21-1 on the substrate and an orthographic projection of the second active layer of the second transistor T2 on the substrate to form a double gate structure.

In an exemplary embodiment, the second scan signal line 22 may be arranged with unequal widths, and a width of the second scan signal line 22 is a dimension of the second scan signal line 22 in the second direction Y. The second scan signal line 22 includes a region overlapping the seventh active layer of the seventh transistor T7 and other regions. A width of the second scan signal line 22 of the region overlapping the seventh active layer of the seventh transistor T7 may be larger than a width of the second scan signal line 22 of the other regions.

In an exemplary embodiment, the light emission control line 23 may be arranged with unequal widths, and a width of the light emission control line 23 is a dimension of the light emission control line 23 in the second direction Y. The light emission control line 23 includes a region overlapping the semiconductor layer and a region not overlapping the semiconductor layer, and a width of the light emission control line 23 of the region overlapping the semiconductor layer may be greater than a width of the light emission control line 23 of the region not overlapping the semiconductor.

In an exemplary embodiment, the first electrode plate 24 also serves as a gate electrode of the third transistor T3, and a region the third active layer of the third transistor T3 overlapping the first electrode plate 24 serves as a channel region 18 of the third transistor T3. An end of the channel region 18 is connected to the first region 13-1 of the third active layer and the other end is connected to the second region 13-2 of the third active layer. A region the first scan signal line 21 overlapping the fourth active layer of the fourth transistor T4 serves as a gate electrode of the fourth transistor T4; a region of the first scan signal line 21 and the gate block 21-1 overlapping the second active layer of the second transistor T2 serve as gate electrodes (double gates) of the second transistor T2; a region the second scan signal line 22 overlapping the first active layer of the first transistor T1 serves as gate electrodes (double gates) of the first transistor T1; a region the second scan signal line 22 overlapping the seventh active layer of the seventh transistor T7 serves as a gate electrode of the seventh transistor T7; a region the light emission control line 23 overlapping the fifth active layer of the fifth transistor T5 serves as a gate electrode of the fifth transistor T5; and a region the light emission control line 23 overlapping the sixth active layer of the sixth transistor T6 serves as a gate electrode of the sixth transistor T6.

In an exemplary embodiment, after the pattern of the first conductive layer is formed, the semiconductor layer may be subjected to a conductive treatment by using the first conductive layer as a shield. The semiconductor layer with a region shielded by the first conductive layer forms channel regions of the first transistor T1 to the seventh transistor T7, and the semiconductor layer with a region not shielded by the first conductive layer is made to be conductive, that is, first regions and second regions of the first active layer to the seventh active layer are made to be conductive.

(3) A pattern of a second conductive layer is formed. In an exemplary embodiment, forming a pattern of a second conductive layer may include depositing a third insulating film and a second metal film in sequence on the substrate where the above-mentioned patterns are formed, patterning a second metal film by a patterning process, forming a third insulating layer 63 covering the first conductive layer, and a pattern of the second conductive layer disposed on a third insulating layer 63. The pattern of the second conductive layer at least includes an initial signal line 31, a second electrode plate 32 of a storage capacitor, a shield electrode 33 and an electrode plate connection line 35, as shown in FIGS. 9A, 9B, 9C and 9D, where FIG. 9B is an enlarged view of the second electrode plate region in FIG. 9A, FIG. 9C is a sectional view taken along A-A in FIG. 9B, and FIG. 9D is a sectional view taken along B-B in FIG. 9B.

Figure 9A:
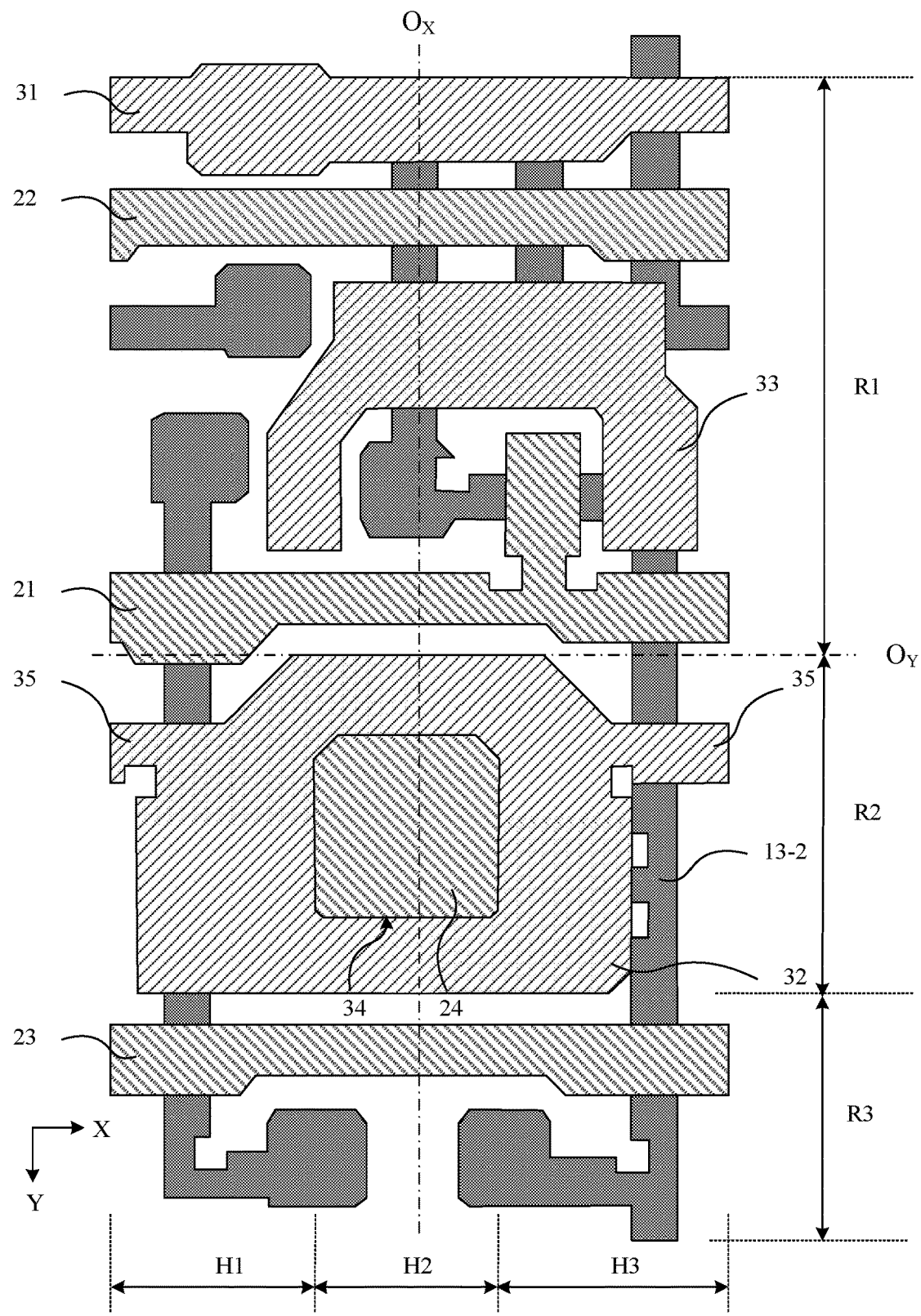
FIG. 9A is a schematic diagram after a pattern of a second conductive layer is formed according to an exemplary embodiment of the present disclosure.
Figure 9B:
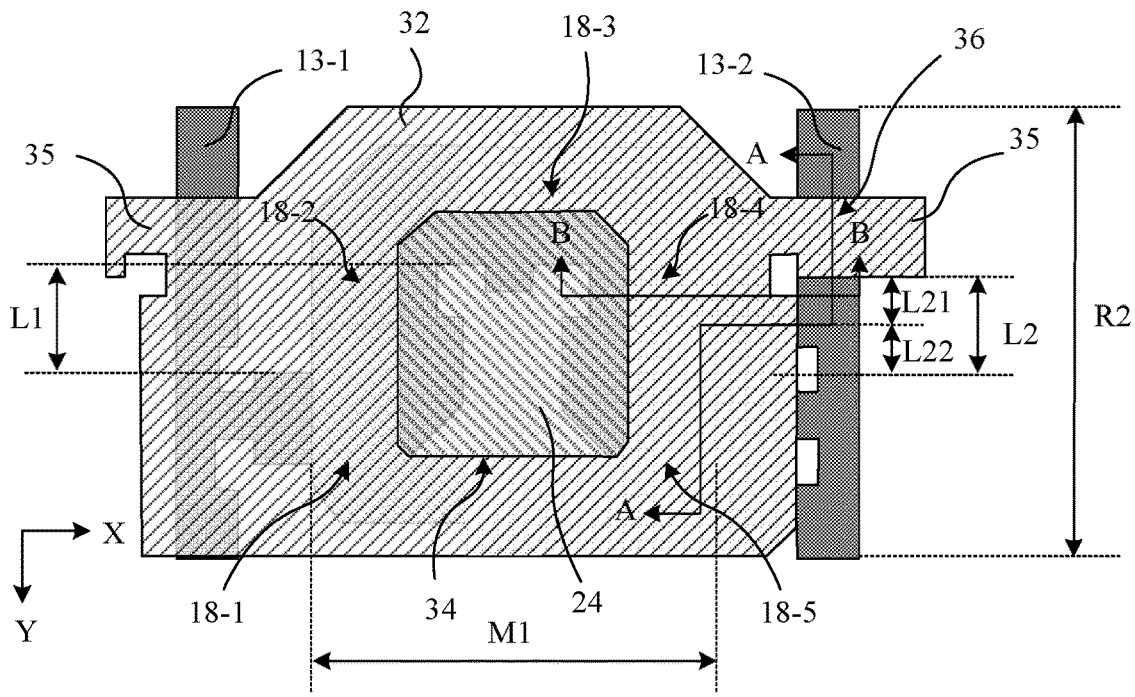
FIG. 9B is an enlarged view of a second electrode plate region in FIG. 9A.
Figure 9C:
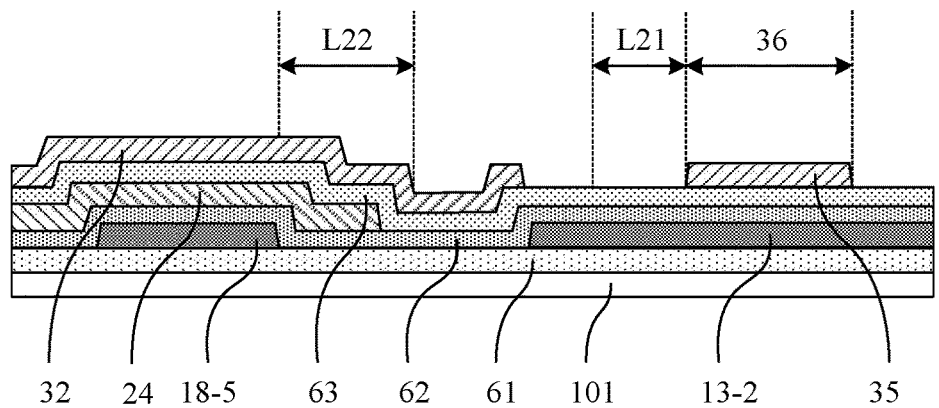
FIG. 9C is a sectional view taken along an A-A direction in FIG. 9B.
Figure 9D:
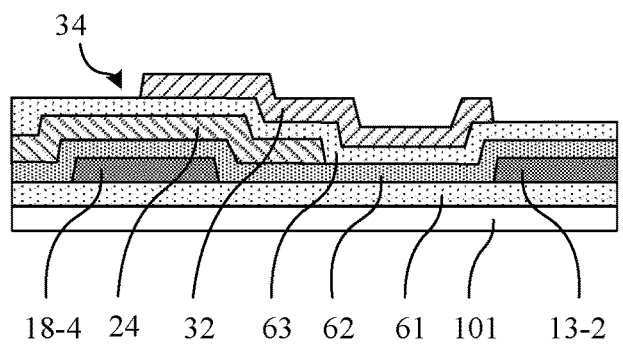
FIG. 9D is a sectional view taken along a B-B direction in FIG. 9B.

As shown in FIG. 9A, in an exemplary embodiment, the initial signal line 31 extending along the first direction X is disposed in the longitudinal first region R1, and is located on a side of the second scan signal line 22 away from the longitudinal second region R2. The shield electrode 33 is disposed in the longitudinal first region R1 between the first scan signal line 21 and the second scan signal line 22. The second electrode plate 32 of the storage capacitor is disposed in the longitudinal second region R2 between the first scan signal line 21 and the light emission control line 23.

In an exemplary embodiment, the initial signal line 31 may be arranged with unequal widths, and a width of the initial signal line 31 is a dimension of the initial signal line 31 in the second direction Y. The initial signal line 31 includes a region overlapping the semiconductor layer and a region not overlapping the semiconductor layer. A width of the initial signal line 31 of the region not overlapping the semiconductor layer may be greater than a width of the initial signal line 31 of the region overlapping the semiconductor layer.

In an exemplary embodiment, the shield electrode 33 is in shape of "n", and the shield electrode 33 is configured to be connected to a first power supply line subsequently formed, thereby improving a working reliability of the pixel drive circuit.

In an exemplary embodiment, a contour of the second electrode plate 32 may be rectangular, and corners of the rectangle may be arranged with chamfer. There is an overlap region between an orthographic projection of the second electrode plate 32 on the substrate and an orthographic projection of the first electrode plate 24 on the substrate. The second electrode plate 32 is provided with an opening 34. In the first direction X, the opening 34 may be located in the horizontal second region H2, and in the second direction Y, the opening 34 may be located in the middle of the longitudinal second region R2. The opening 34 may be rectangular, so that the second electrode plate 32 forms an annular structure. The opening 34 exposes the third insulating layer 63 covering the first electrode plate 24, and the orthographic projection of the first electrode plate 24 on the substrate contains an orthographic projection of the opening 34 on the substrate. In an exemplary embodiment, the opening 34 is configured to accommodate a first via hole subsequently formed, which is located in the opening 34 and exposes the first electrode plate 24, so that a second electrode of the first transistor T1 subsequently formed is connected to the first electrode plate 24.

In an exemplary embodiment, an electrode plate connection line 35 is disposed between second electrode plates 32 of adjacent sub-pixels, a first end of the electrode plate connection line 35 is connected to the second electrode plate 32 of the present sub-pixel, and a second end of the electrode plate connection line 35 extending along the first direction X or an opposite direction of the first direction X is connected to the second electrode plates 32 of the adjacent sub-pixels, that is, the electrode plate connection line 35 is configured to connect the second electrode plates of the adjacent sub-pixels in the first direction X. In an exemplary embodiment, second electrode plates in a sub-pixel row form an integrated structure connected to each other through the electrode plate connection line 35, and the second electrode plates in the integrated structure may be reused as power supply signal lines, thus ensuring that a plurality of second electrode plates in a sub-pixel row have a same potential, which is beneficial to improving uniformity of the panel, avoiding a poor display of the display substrate and ensuring a display effect of the display substrate.

In an exemplary embodiment, an orthographic projection of an edge of the second electrode plate 32 on the substrate adjacent to the longitudinal first region R1 is overlapped with an orthographic projection of a boundary line of the longitudinal first region R1 and the longitudinal second region R2 on the substrate; an orthographic projection of an edge of the second electrode plate 32 adjacent to the longitudinal third region R3 on the substrate is overlapped with an orthographic projection of a boundary line of the longitudinal second region R2 and the longitudinal third region R3 on the substrate, that is, a second length of the second electrode plate 32 is equal to a second length of the longitudinal second region R2, and the second length of the second electrode plate 32 refers to a dimension of the second electrode plate 32 in the second direction Y.

As shown in FIG. 9B, in an exemplary embodiment, there is an overlap region 36 between the second region 13-2 of the third active layer extending in the second direction Y and the electrode plate connection line 35 extending in the first direction X. In the second stage of the operation of the pixel drive circuit, a low level signal output by the first scan signal line 21 turns the second transistor, the fourth transistor and the seventh transistor on, and meanwhile the first electrode plate of the storage capacitor is at a low level to turn on the third transistor, so that a data voltage output by the data signal line passes through the fourth active layer, the third active layer and the second active layer respectively, so that a difference between the data voltage output by the data signal line and a threshold voltage of the third transistor T3 is charged into the first electrode plate 24 of the storage capacitor. Since the second region 13-2 of the third active layer and the electrode plate connection line 35 form overlapping capacitance, the channel region 18 of the third transistor has a fourth channel segment 18-4 extending along the second direction Y. If there is a region oppositely disposed between an edge of the overlap region 36 near the fourth channel segment 18-4 and an edge of the fourth channel segment 18-4 near the overlap region 36, that is, if the edge of the overlap region 36 is oppositely disposed to the edge of the fourth channel segment 18-4 in the first direction X, then the overlap region 36 will affect the transmission of data signals by the fourth channel segment 18-4, thereby increasing a load of the third transistor, increasing power consumption of the pixel drive circuit, and reducing display quality.

In an exemplary embodiment, a minimum distance L2 between the overlap region 36 and the channel region 18 of the third transistor may be greater than or equal to the second direction effective length L1 of the channel region 18.

The L2 may be a distance between an edge of the overlap region 36 adjacent to the fifth channel segment 18-5 in the second direction Y extending along the first direction X and an edge of the fifth channel segment 18-5 adjacent to the overlap region 36 in the second direction Y extending along the first direction X.

In an exemplary embodiment, a distance L2 may be greater than or equal to 1.5 μm. In some possible implementations, a distance L2 may approximately be 1.6 μm to 4.5 μm. In other possible implementations, a distance L2 may approximately be 2.5 μm to 4.5 μm.

In an exemplary embodiment, a width of the electrode plate connection line 35 may be about 2 μm to 4 μm, and a width of the second region 13-2 of the third active layer may approximately be 1.8 μm to 2.0 μm, so as to reduce an area of the overlap region 36.

In the exemplary embodiment of the present disclosure, by setting a minimum distance between the overlap region and the channel region of the third transistor, there is no region oppositely disposed between a channel segment extending in the second direction in the channel region and the overlap region, which reduces an impact of the overlapping capacitance on the drive transistor, reduces a load of the drive transistor, reduces power consumption of the pixel drive circuit, and improves a display effect.

As shown in FIGS. 9C and 9D, in a direction perpendicular to the substrate, a first insulating layer 61 is disposed on the substrate 101, and a semiconductor layer is disposed on the first insulating layer 61. The semiconductor layer at least includes a second region 13-2 of the third active layer and a channel region 18 of the third active layer, and the channel region 18 of the third active layer at least includes a fourth channel segment 18-4 and a fifth channel segment 18-5. A second insulating layer 62 covers the semiconductor layer, and a first conductive layer is disposed on the second insulating layer 62, and the first conductive layer at least includes the first electrode plate 24 of the storage capacitor. A third insulating layer 63 covers the first conductive layer, and a second conductive layer is disposed on the third insulating layer 63. The second conductive layer at least includes the second electrode plate 32 of the storage capacitor and the electrode plate connection line 35.

In an exemplary embodiment, there is an overlap region 36 between the second region 13-2 of the third active layer and the electrode plate connection line 35, and a distance L2 between an edge of the overlap region 36 adjacent to the fifth channel segment 18-5 and an edge of the fifth channel segment 18-5 adjacent to the overlap region 36 is L21+L22.

In an exemplary embodiment, there is an overlap region between an orthographic projection of the second electrode plate 32 on the substrate and the orthographic projection of the first electrode plate 24 on the substrate. The second electrode plate 32 is provided an opening, and the opening 34 exposes the third insulating layer 63 covering the first electrode plate 24.

(4) A pattern of a fourth insulating layer is formed. In an exemplary embodiment, forming a pattern of a fourth insulating layer may include depositing a fourth insulating film on the substrate where the above-mentioned patterns are formed, patterning the fourth insulating film by a patterning process, and forming a fourth insulating layer covering the second conductive layer. The fourth insulating layer is provided with a plurality of via holes, and the plurality of via holes at least include: a first via hole V1, a second via hole V2, a third via hole V3, a fourth via hole V4, a fifth via hole V5, a six via hole V6, a seventh via hole V7, an eighth via hole V8 and a ninth via hole V9, as shown in FIGS. 10A, 10B, 10C and 10D, FIG. 10B is an enlarged view of the second electrode plate region in FIG. 10A; FIG. 10C is a sectional view taken along an A-A direction in FIG. 10B; and FIG. 10D is a sectional view taken along a B-B direction in FIG. 10B.

Figure 10A:
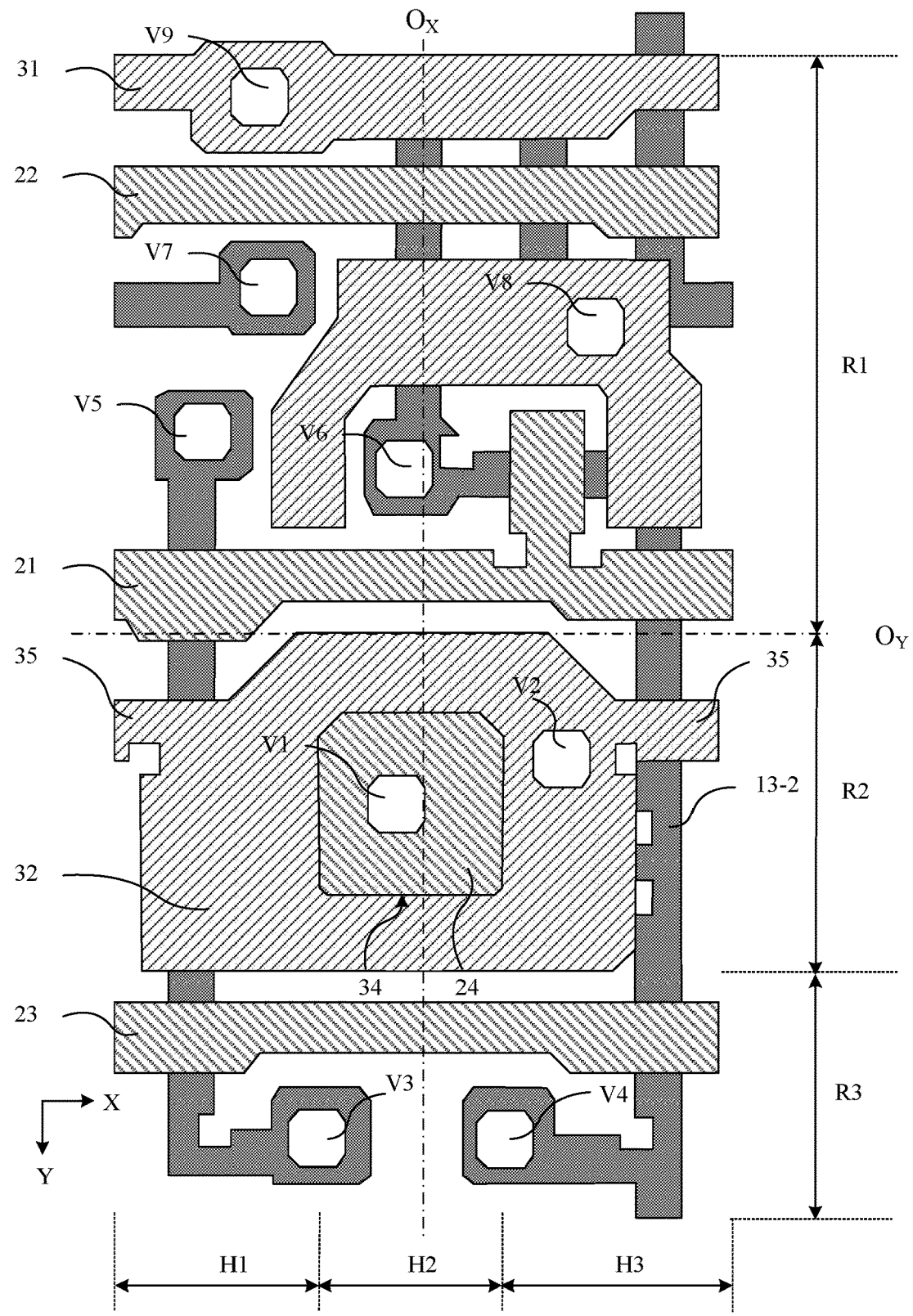
FIG. 10A is a schematic diagram of a display substrate after a pattern of a fourth insulating layer is formed according to an exemplary embodiment of the present disclosure.
Figure 10B:
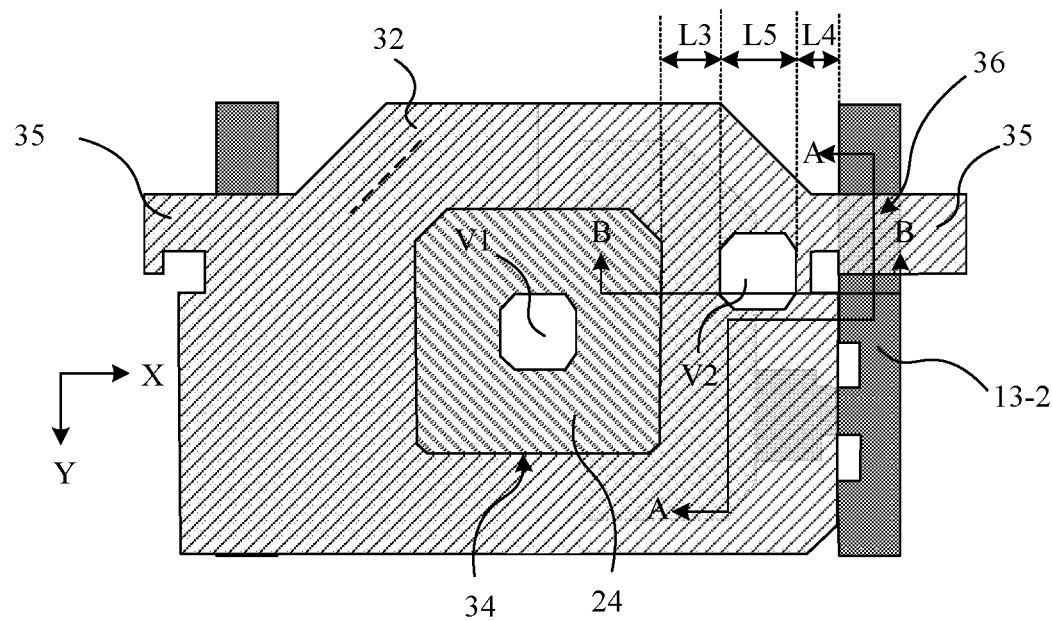
FIG. 10B is an enlarged view of a second electrode plate region in FIG. 10A.
Figure 10C:
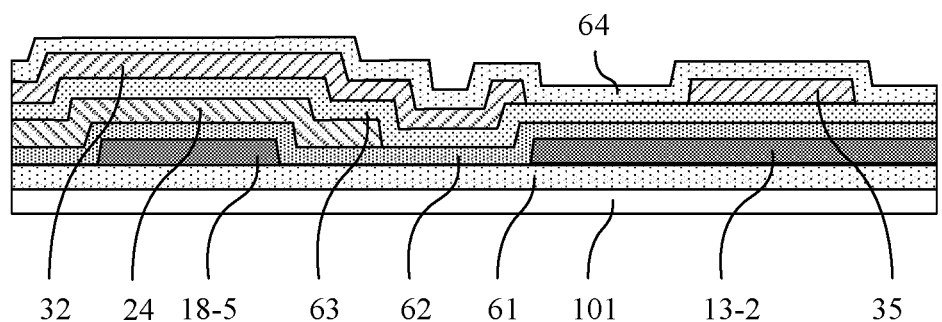
FIG. 10C is a sectional view taken along an A-A direction in FIG. 10B.
Figure 10D:
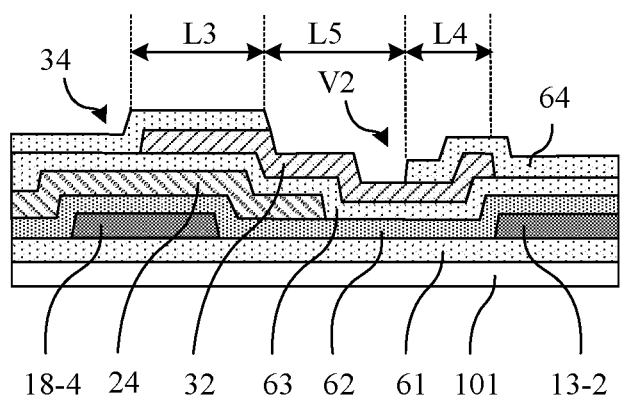
FIG. 10D is a sectional view taken along a B-B direction in FIG. 10B.

As shown in FIG. 10A, in an exemplary embodiment, the first via hole V1 is located in the opening 34 of the second electrode plate 32, and an orthographic projection of the first via hole V1 on the substrate is within a range of an orthographic projection of the opening 34 on the substrate. A fourth insulating layer and a third insulating layer in the first via hole V1 are etched away to expose a surface of the first electrode plate 24. The first via hole V1 is configured to connect a second electrode of the first transistor T1 subsequently formed to the first electrode plate 24 through the via hole.

In an exemplary embodiment, the second via hole V2 is located between the opening 34 and the second region 13-2 of the third active layer, and an orthographic projection of the second via hole V2 on the substrate is within a range of an orthographic projection of the second electrode plate 32 on the substrate, and a fourth insulating layer in the second via hole V2 is etched away to expose a surface of the second electrode plate 32. The second via hole V2 is configured to connect a first power supply line VDD subsequently formed to the second electrode plate 32 through the via hole, and the second via hole V2 serves as a power via hole.

In an exemplary embodiment, the third via hole V3 is located in the longitudinal third region R3, and a fourth insulating layer, a third insulating layer, and a second insulating layer in the third via hole V3 are etched away to expose a surface of a first region of the fifth active layer. The third via hole V3 is configured to connect a first electrode of the fifth transistor T5 subsequently formed to the fifth active layer through the via hole V3.

In an exemplary embodiment, the fourth via hole V4 is located in the longitudinal third region R3, and a fourth insulating layer, a third insulating layer, and a second insulating layer in the fourth via hole V4 are etched away to expose a surface of a second region of the sixth active layer (as well as a second region of the seventh active layer). The fourth via hole V4 is configured to connect a second electrode of the sixth transistor T6 subsequently formed to the sixth active layer through the via hole V4; and connect a second electrode of the seventh transistor T7 subsequently formed to the seventh active layer through the via hole V4.

In an exemplary embodiment, the fifth via hole V5 is located in the longitudinal first region R1, and a fourth insulating layer, a third insulating layer, and a second insulating layer in the fifth via hole V5 are etched away to expose a surface of a first region of the fourth active layer. The fifth via hole V5 is configured to connect a first electrode of the fourth transistor T4 subsequently formed to the fourth active layer through the via hole V5.

In an exemplary embodiment, the sixth via hole V6 is located in the longitudinal first region R1, and a fourth insulating layer, a third insulating layer, and a second insulating layer in the sixth via hole V6 are etched away to expose a surface of a second region of the first active layer (as well as a second region of the second active layer). The sixth via hole V6 is configured to connect a second electrode of the first transistor T1 subsequently formed to the first active layer through the sixth via hole V6 and connect a first electrode of the second transistor T2 subsequently formed to the second active layer through the sixth via hole V6.

In an exemplary embodiment, the seventh via hole V7 is located in the longitudinal first region R1, and a fourth insulating layer, a third insulating layer, and a second insulating layer in the seventh via hole V7 are etched away to expose a surface of a first region of the seventh active layer (as well as a first region of the first active layer). The seventh via hole V7 is configured to connect a first electrode of the seventh transistor T7 subsequently formed to the seventh active layer through the via hole V7 and connect a first electrode of the first transistor T1 subsequently formed to the first active layer through the via hole V7.

In an exemplary embodiment, the eighth via hole V8 is located in the longitudinal first region R1, and a fourth insulating layer in the eighth via hole V8 is etched away to expose a surface of the shield electrode 33. The eighth via hole V8 is configured to connect a first power supply line VDD subsequently formed to the shield electrode 33 through the via hole V8.

In an exemplary embodiment, the ninth via hole V9 is located in the longitudinal first region R1, and a fourth insulating layer in the ninth via hole V9 is etched away to expose a surface of the initial signal line 31. The ninth via hole V9 is configured to connect a first electrode of the seventh transistor T7 (as well as the first electrode of the first transistor T1) subsequently formed to the initial signal line 31 through the via hole V9.

As shown in FIG. 9B, in an exemplary embodiment, the second via hole V2 is configured to connect the first power supply line VDD subsequently formed to the second electrode plate 32 through the via hole V2. Since there is an overlap region between the opening 34 on the second electrode plate 32 and the first electrode plate 24, if a distance between the second via hole V2 and the opening 34 is small, the formed second via hole V2 will expose the first electrode plate 24, which will lead to a connection between the first power supply line VDD and the first electrode plate 24, resulting in a short circuit between the first power supply line VDD and a gate electrode of the third transistor T3. Since the second electrode plate 32 is adjacent to the second region 13-2 of the third active layer, if a distance between the second via hole V2 and the second region 13-2 of the third active layer is small, the formed second via hole V2 will expose the second region 13-2 of the third active layer, which will lead to a connection between the first power supply line VDD and the second region 13-2 of the third active layer, resulting in a short circuit between the first power supply line VDD and a data line DATA.

In an exemplary embodiment, a distance L3 between an edge of the second via V2 on a side adjacent to the opening 34 and an edge of the opening 34 on a side adjacent to the second via hole V2 may be greater than or equal to a distance L4 between an edge of the second via hole V2 on a side adjacent to the second region 13-2 of the third active layer and an edge of the second region 13-2 of the third active layer on a side adjacent to the second via hole V2.

In an exemplary embodiment, a distance L3 between an edge of the second via hole V2 on a side adjacent to the opening 34 and an edge of the opening 34 on a side adjacent to the second via hole V2 may be greater than or equal to 0.85 µm. In some possible implementations, a distance L3 may approximately be 1.5 µm to 3.0 µm. In other possible implementations, a distance L3 may approximately be 2.0 µm to 3.0 µm.

In an exemplary embodiment of the present disclosure, a distance L4 between an edge of the second via hole V2 on a side adjacent to the second region 13-2 (the overlap region 36) of the third active layer and an edge of the second region 13-2 of the third active layer on a side adjacent to the second via hole V2 may be greater than or equal to 0.6 µm. In some possible implementations, a distance L4 may approximately be 1.2 µm to 3.0 µm. In other possible implementations, a distance L4 may approximately be 2.0 µm to 3.0 µm.

In an exemplary embodiment, a distance L5 between an edge of the second via hole V2 on a side adjacent to the opening 34 and an edge of the second via hole V2 on a side adjacent to the second region 13-2 of the third active layer may approximately be 2.0 µm to 2.5 µm.

In an exemplary embodiment, a high PPI display has been called a design trend product with a finer image quality display and higher display quality. Since a pixel area of a high PPI display is small, which is not conducive to layouts of pixel drive circuits, it is needed to comprehensively consider various factors when arranging pixel drive circuits in a limited space. Increasing a distance L2 may reduce an impact of overlapping capacitance on data signal transmission, reduce a load and power consumption, increasing a distance L3 may avoid a short circuit between the first power supply line VDD and the gate electrode of the third transistor T3, and increasing a distance L4 may avoid a short circuit between the first power supply line VDD and the initial signal line INIT, but it is not conducive to an overall arrangement. Considering comprehensively, the distance L2 may be set to be greater than the distance L3. In some possible implementations, a difference between the distance L2 and the distance L3 may approximately be 0.3 µm to 0.6 µm.

In the exemplary embodiment of the present disclosure, by setting a distance L3 between an edge of the second via hole V2 on a side adjacent to the opening 34 and an edge of the opening 34 on a side adjacent to the second via hole V2 to be greater than or equal to 0.85 µm, and setting a distance L4 between an edge of the second via hole V2 on a side adjacent to the overlap region 36 and an edge of the overlap region 36 on a side adjacent to the second via hole V2 to be greater than or equal to 0.6 µm, the process margin is improved, the short circuit is avoided, and the yield is improved.

As shown in FIG. 10C and FIG. 10D, in a direction perpendicular to the substrate, a fourth insulating layer 64 covering the second conductive layer, the second conductive layer is provided with a plurality of via holes, and the plurality of via holes at least include the second via hole V2, and the fourth insulating layer 64 in the second via hole V2 is etched away to expose a surface of the second electrode plate 32. A distance L3 between an edge of the second via hole V2 on a side adjacent to the opening 34 and an edge of the opening 34 on a side adjacent to the second via hole V2 may be greater than or equal to a distance L4 between an edge of the second via hole V2 on a side adjacent to the second region 13-2 of the third active layer and an edge of the second region 13-2 of the third active layer on a side adjacent to the second via hole V2.

In an exemplary embodiment, a distance L3 may be greater than or equal to 0.85 μm, and a distance L4 may be greater than or equal to 0.6 μm.

(5) A pattern of a third conductive layer is formed. In an exemplary embodiment, forming a third conductive layer may include depositing a third metal thin film on the substrate where the aforementioned patterns are formed, patterning the third metal thin film by a patterning process, and forming a third conductive layer disposed on the fourth insulating layer. The third conductive layer at least includes a first power supply line 41, a second electrode 42 of the first transistor T1, a first electrode 43 of the seventh transistor T7, a first electrode 44 of the fourth transistor T4, and a first electrode 45 of the fifth transistor T5 and a second electrode 46 of the sixth transistor T6, as shown in FIG. 11A and FIG. 11B, and FIG. 11B is a sectional view taken along a B-B direction in FIG. 11A.

Figure 11A:
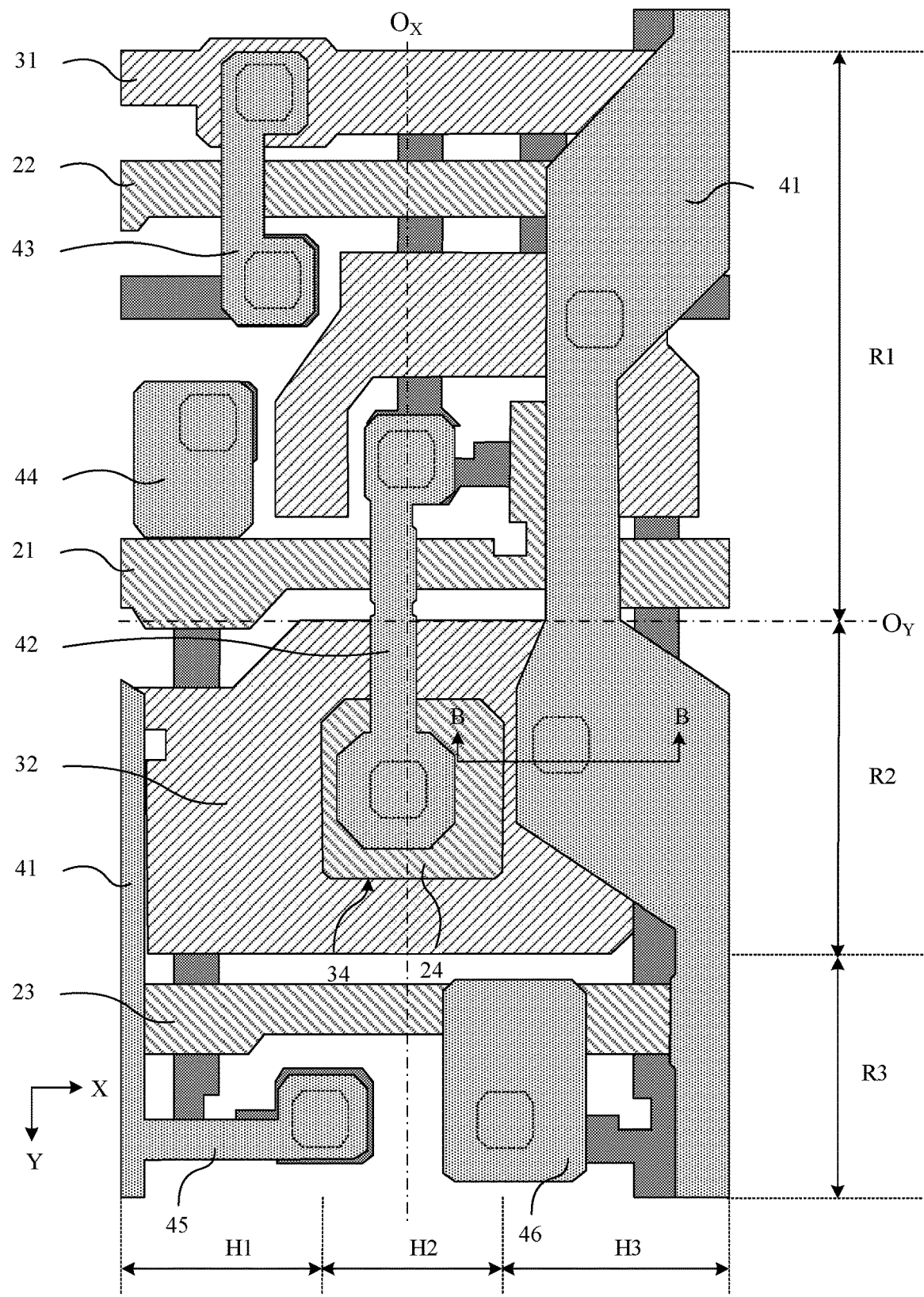
FIG. 11A is a schematic diagram after a pattern of a third conductive layer is formed according to an exemplary embodiment of the present disclosure.
Figure 11B:
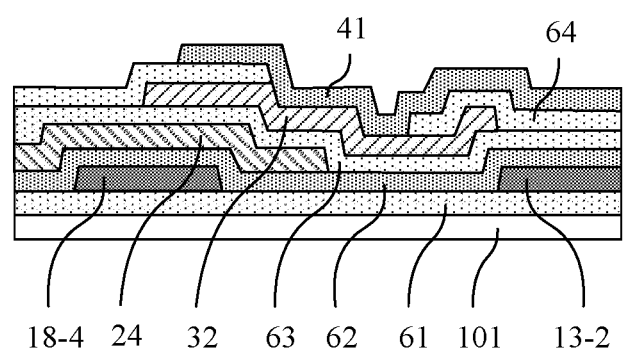
FIG. 11B is a sectional view taken along a B-B direction in FIG. 11A.

As shown in FIGS. 11A and 11B, in an exemplary embodiment, the first power supply line 41 is disposed on the fourth insulating layer 64, and is connected to the shield electrode 33 through the eighth via hole V8 on the one hand, and is connected to the second electrode plate 32 through the second via hole V2 on the other hand, so that the shield electrode 33 and the second electrode plate 32 have a same potential as the first power supply line 41.

In an exemplary embodiment, a second electrode 42 of the first transistor T1 also serves as a first electrode of the second transistor T2, with its first end connected to a first active layer of the first transistor T1 through the sixth via hole V6 and its second end connected to the first electrode plate 24 through the first via hole V1, so that the first electrode plate 24, the second electrode 42 of the first transistor T1 and the first electrode of the second transistor T2 have a same potential.

In an exemplary embodiment, a first electrode 43 of the seventh transistor T7 also serves as a first electrode of the first transistor T1 with its first end connected to the initial signal line 31 through the ninth via hole V9, and its second end connected to s seventh active layer of the seventh transistor T7 through the seventh via hole V7, so that the first electrode 43 of the seventh transistor T7 and the first electrode of the first transistor T1 have a same potential as the initial signal line 31.

In an exemplary embodiment, a first electrode 44 of the fourth transistor T4 is connected to a fourth active layer of the fourth transistor T4 through the fifth via V5. In an exemplary embodiment, a first electrode 44 of the fourth transistor T4 is configured to be connected to the data signal line DATA formed subsequently, and thus the fifth via V5 serves as a data writing hole.

In an exemplary embodiment, a first end of the first electrode 45 of the fifth transistor T5 is connected to the first power supply line 41, and a second end is connected to a fifth active layer of the fifth transistor T5 through the third via hole V3. In an exemplary embodiment, the first electrode 45 of the fifth transistor T5 and the first power supply line 41 may be integrated to each other.

In an exemplary embodiment, a second electrode 46 of the sixth transistor T6 also serves as a second electrode of the seventh transistor T7, and its first end is connected to a sixth active layer of the sixth transistor T6 through the fourth via hole V4. In an exemplary embodiment, a second electrode 46 of the sixth transistor T6 is configured to be connected to a second connection electrode formed subsequently, and the second connection electrode is configured to be connected to an anode formed subsequently.

In an exemplary embodiment, the first power supply line 41 may be a bend line with unequal widths, and a width of the first power line 41 is a dimension of the first power line 41 in the first direction X. In an exemplary embodiment, along the second direction Y, the first power supply line 41 may include a first power supply part, a second power supply part, a third power supply part and a fourth power supply part connected in sequence. A width of the first power supply part may be greater than a width of the second power supply part, a width of the third power supply part may be greater than a width of the fourth power supply part, and the width of the third power supply part may be greater than the width of the first power supply part. The first power supply line 41 is arranged as a bend line with a variable width, which not only facilitates a layout of a pixel structure, but also reduces parasitic capacitance.

In an exemplary embodiment, the first power supply part and the third power supply part may be parallelograms, and the second power supply part and the fourth power supply part may be rectangles, that is, the rectangles are disposed between the two parallelograms. A pair of edges of the first power supply part extends along the second direction Y, and the other pair of edges extend along a first inclined direction. The first inclined direction and the second direction Y have a first included angle, and the first included angle may be greater than 0 degrees and less than 90 degrees. In an exemplary embodiment, a pair of edges of the third power supply part extends along a second direction Y, and another pair of edges extends along a second inclined direction, the second inclined direction and the second direction Y have a second included angle, and the second included angle may be greater than 0 degrees and less than 90 degrees. In an exemplary embodiment, the first included angle may be equal to the second included angle, and the first inclined direction and the second inclined direction are mirror symmetric with respect to the second centerline OY.

Figure 12:
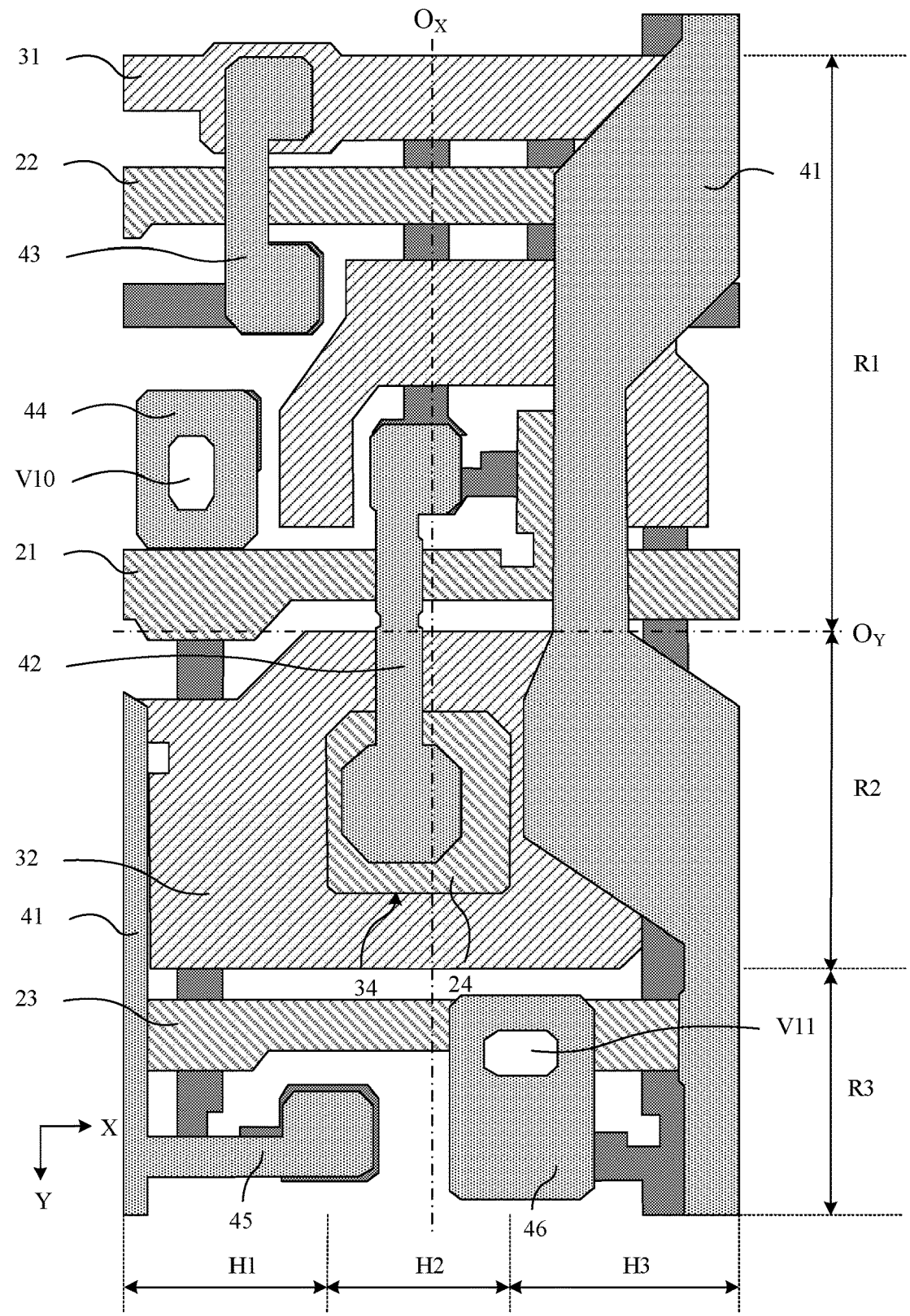
FIG. 12 is a schematic diagram after a pattern of a fifth insulating layer is formed according to an exemplary embodiment of the present disclosure.

(6) A pattern of a fifth insulating layer is formed. In an exemplary embodiment, forming the fifth insulating layer pattern may include depositing a fifth insulating film on the substrate where the aforementioned patterns are formed, patterning the fifth insulating film by a patterning process to form a fifth insulating layer covering a third conductive layer, wherein the fifth insulating layer is provided with a plurality of via holes, and the plurality of via holes at least include a tenth via hole V10 and an eleventh via hole V11, as shown in FIG. 12.

In an exemplary embodiment, the tenth via hole V10 is located in the longitudinal first region R1, and a fifth insulating layer in the tenth via hole V10 is etched away to expose a surface of the first electrode 44 of the fourth transistor T4. A tenth via hole V10 is configured to connect a data signal line DATA subsequently formed to a first electrode 44 of the fourth transistor T4 through the via hole V10.

In an exemplary embodiment, the eleventh via hole V11 is located in the longitudinal third region R3, and a fifth insulating layer in the eleventh via hole V11 is etched away to expose a surface of the second electrode 46 of the sixth transistor T6. The eleventh via hole V11 is configured to connect a second connection electrode formed subsequently to a second electrode 46 of the sixth transistor T6 through the via hole V11.

Figure 13:
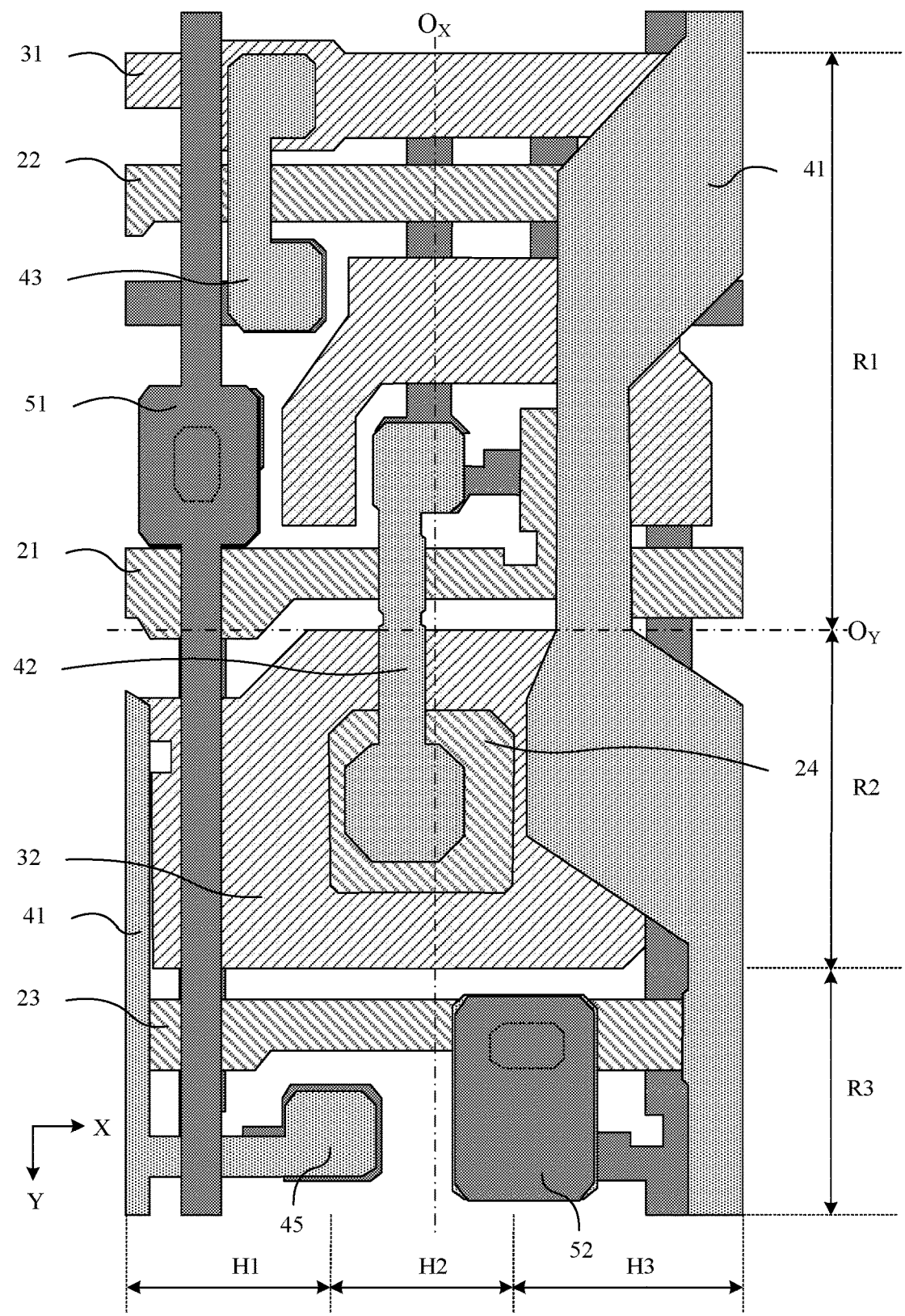
FIG. 13 is a schematic diagram after a pattern of a fourth conductive layer is formed according to an exemplary embodiment of the present disclosure.

(7) A pattern of a fourth conductive layer is formed. In an exemplary embodiment, forming a pattern of the fourth conductive layer may include depositing a fourth metal film on the substrate where the aforementioned patterns are formed, patterning the fourth metal film by a patterning process, and forming a fourth conductive layer disposed on the fifth insulating layer, wherein the fourth conductive layer at least includes a data signal line 51 and an anode connection electrode 52, as shown in FIG. 13.

In an exemplary embodiment, the data signal line 51 extends in the second direction Y and is connected to a first electrode 44 of the fourth transistor T4 through the tenth via hole V10. The anode connection electrode 52 is rectangular and located in the longitudinal third region R3, and is connected to a second electrode 46 of the sixth transistor T6 through the eleventh via hole V11. The anode connection electrode 52 is configured to be connected to an anode subsequently formed.

In an exemplary embodiment, the subsequent preparation process may include: coating a planarization thin film on the substrate where the aforementioned patterns are formed, and patterning the flat film by a patterning process to form a planarization layer covering the fourth conductive layer, wherein the planarization layer is provided with a twelfth via hole exposing a surface of the anode connection electrode 52. Subsequently, a conductive film is deposited on the substrate where the aforementioned patterns are formed, and the conductive film is patterned by a patterning process to form an anode disposed on the planarization layer, and the anode is connected to the anode connection electrode 52 through the twelfth via. Because the anode is connected to the anode connection electrode 52 and the anode connection electrode 52 is connected to a second electrode 46 of the sixth transistor T6, thus achieving that a pixel drive circuit may drive a light emitting device to emit light. Subsequently, a pixel define film is coated on the anode, and the pixel define film is patterned through a patterning process to form a pixel define layer. The pixel define layer of each sub-pixel is provided with a pixel opening, and the pixel opening exposes the anode. Subsequently, an organic light-emitting layer is formed by an evaporation process, and a cathode is formed on the organic light-emitting layer. Subsequently, an encapsulation layer is formed. The encapsulation layer may include a first encapsulation layer, a second encapsulation layer and a third encapsulation layer which are stacked. The first encapsulation layer and the third encapsulation layer may be made of inorganic materials, and the second encapsulation layer may be made of an organic material. The second encapsulation layer is disposed between the first encapsulation layer and the third encapsulation layer, which may ensure that external vapor may not enter the light emitting device.

In an exemplary implementation, the substrate may be a flexible substrate or may be a rigid substrate. The rigid substrate may be, but is not limited to, one or more of glass and quartz. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo. The first insulating layer, the second insulating layer, the third insulating layer, the fourth insulating layer, and the fifth insulating layer may be made of any one or more of silicon oxide (SiOx), silicon nitride (SiNx) and silicon oxynitride (SiON), and may be a single layer, a multilayer, or a composite layer. The first insulating layer is called a Buffer layer to improve a water and oxygen resistance capability of the substrate, the second insulating layer and third insulating layer are called gate insulating (GI) layers, the fourth insulating layer is called an interlayer dielectric (ILD) layer, and the fifth insulating layer is called a passivation (PVX) layer. The active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic technology. The planarization layer may be made of an organic material, the transparent conductive thin film may be made of indium tin oxide (ITO) or indium zinc oxide (IZO), and the pixel define layer may be made of polyimide, acrylic or polyethylene terephthalate. The cathode may be made of any one or more of magnesium (Mg), silver (Ag), aluminum (Al), copper (Cu) and lithium (Li), or an alloy made of any one or more of the above metals.

In an exemplary embodiment, the thickness of the first insulating layer is 3000 to 5000 angstroms, the thickness of the second insulating layer is 1000 to 2000 angstroms, the thickness of the third insulating layer is 4500 to 7000 angstroms, the thickness of the fourth insulating layer is 3000 to 5000 angstroms, and the thickness of the fifth insulating layer is 3000 to 5000 angstroms.

The structure shown in the present disclosure and the manufacturing process thereof are merely an exemplary description. In an exemplary embodiment, corresponding structures may be changed and patterning processes may be added or reduced according to actual needs, which is not specifically limited herein in the present disclosure.

It be seen from the structure and preparation process of the display substrate described above that in the display substrate provided by the present disclosure, by setting a distance between the overlap region and the channel region of the drive transistor, an impact of overlapping capacitance on the transmission of data signals by the drive transistor is effectively reduced, the load of the drive transistor and the power consumption of the pixel drive circuit are reduced, and the display effect is improved. By setting a distance between the second via hole and the opening and a distance between the second via hole and the second region of the drive transistor, the process margin is improved, the short circuit is avoided, and the yield is improved. The preparation process according to the present disclosure may be compatible well with the existing preparation process, which is simple to implement, and easy to carry out, and thus the production efficiency is high, the production cost is low and the yield rate is high.

The present disclosure further provides a preparation method of a display substrate, to manufacture the display substrate according to the above-mentioned embodiments. In an exemplary embodiment, in a direction parallel to the display substrate, the display substrate includes a plurality of sub-pixels, at least one sub-pixel includes a pixel drive circuit and a light emitting device connected to the pixel drive circuit, and the pixel drive circuit at least includes a drive transistor and a storage capacitor; the method includes:

sequentially forming a semiconductor layer, a first conductive layer and a second conductive layer on a substrate; the semiconductor layer at least includes an active layer of the drive transistor; the first conductive layer at least includes a first electrode plate of the storage capacitor, and the second conductive layer at least includes a second electrode plate of the storage capacitor and an electrode plate connection line; the electrode plate connection line is connected to a second electrode plate of an adjacent sub-pixel in a first direction; and the first direction is a direction of a sub-pixel row;

An active layer of the drive transistor at least includes a channel region, and the channel region at least includes a first channel segment extending along the first direction and a second channel segment extending along a second direction, wherein the second direction is a direction of a sub-pixel column; the channel region has a second direction effective length in a second direction, and the second direction effective length is a length of the second channel segment in the second direction;

There is an overlap region between an orthographic projection of the electrode plate connection line on the substrate and an orthographic projection of the semiconductor layer on the substrate, and a distance between the overlap region and the channel region of the drive transistor is greater than or equal to the effective length in the second direction.

In an exemplary embodiment, a distance between the overlap region and the channel region of the drive transistor is greater than or equal to 1.5 µm.

In an exemplary embodiment, the preparation method further includes:

forming a third conductive layer, wherein the third conductive layer at least includes a first power supply line, and the first power supply line is connected to the second electrode plate through a power via hole; the second electrode plate is provided with an opening, and the power via hole is disposed between the opening and the overlap region; a distance between an edge of the power via hole on a side adjacent to the opening in the first direction and an edge of the opening on a side adjacent to the power via hole in the first direction is greater than or equal to a distance between an edge of the power via hole on a side adjacent to the overlap region in the first direction and an edge of the overlap region on a side adjacent to the power via hole in the first direction.

In an exemplary embodiment, a distance between an edge of the power via hole on a side adjacent to the opening in the first direction and an edge of the opening on a side adjacent to the power via hole in the first direction is greater than or equal to 0.85 µm; a distance between an edge of the power via hole on a side adjacent to the overlap region in the first direction and an edge of the overlap region on a side adjacent to the power via hole in the first direction is greater than or equal to 0.6 µm.

The display substrates manufactured by the preparation method of a display substrate according to the present disclosure have similar implementation principles and implementation effects, which will not be further repeated here.

The present disclosure further provides a display device including the display substrate described above. The display apparatus may be any product or component with a display function, such as a mobile phone, a tablet computer, a television, a display, a notebook computer, a digital photo frame, a navigator, etc., and the embodiments of the present invention are not limited thereto.

Although implementations disclosed in the present disclosure are as the above, the described contents are only implementations used for facilitating understanding the present disclosure, and are not used to limit the present invention. Any person skilled in the art to which the present disclosure pertains may make any modification and variation in forms and details of implementation without departing from the spirit and scope of the present disclosure, however, the patent protection scope of the present disclosure shall still be subject to the scope defined by the appended claims.

What is claimed is:

1. A display substrate, wherein
in a direction parallel to the display substrate, the display substrate comprises a plurality of sub-pixels, at least one sub-pixel comprising a pixel drive circuit and a light emitting device connected to the pixel drive circuit, wherein the pixel drive circuit at least comprises a drive transistor and a storage capacitor; in a direction perpendicular to the display substrate, the display substrate comprises a semiconductor layer, a first conductive layer and a second conductive layer which are sequentially disposed on a substrate; the semiconductor layer at least comprises an active layer of the drive transistor; the first conductive layer at least comprises a first electrode plate of the storage capacitor, and the second conductive layer at least comprises a second electrode plate of the storage capacitor and an electrode plate connection line; the electrode plate connection line is connected to a second electrode plate of an adjacent sub-pixel in a first direction; the first direction is a direction of a sub-pixel row;

the active layer of the drive transistor at least comprises a channel region, and the channel region at least comprises a first channel segment extending along the first direction and a second channel segment extending along a second direction, wherein the second direction is a direction of a sub-pixel column; the channel region has a second direction effective length in the second direction, and the second direction effective length is a length of the second channel segment in the second direction; and there is an overlap region between an orthographic projection of the electrode plate connection line on the substrate and an orthographic projection of the semiconductor layer on the substrate, and a distance between the overlap region and the channel region of the drive transistor is greater than or equal to the effective length in the second direction.

2. The display substrate of claim 1, wherein the distance between the overlap region and the channel region of the drive transistor is greater than or equal to 1.5 µm.

3. The display substrate of claim 1, wherein the distance between the overlap region and the channel region of the drive transistor is 1.6 µm to 4.5 µm.

4. A display apparatus, comprising the display substrate of claim 1.

5. The display substrate of claim 1, wherein the active layer of the drive transistor further comprises a first region and a second region respectively connected to the channel region, and the semiconductor layer in the overlap region comprises a second region of the drive transistor.

6. The display substrate of claim 5, wherein the channel region of the drive transistor comprises a first channel segment, a second channel segment, a third channel segment, a fourth channel segment and a fifth channel segment; a first end of the first channel segment is connected to the first region, and a second end of the first channel segment is connected to a first end of the second channel segment after extending along the first direction; a second end of the second channel segment is connected to the first end of the third channel segment after extending along an opposite direction of the second direction; a second end of the third channel segment is connected to a first end of the fourth channel segment after extending along the first direction; a second end of the fourth channel segment is connected to a first end of the fifth channel segment after extending along the second direction; and a second end of the fifth channel segment is connected to the second region after extending along the first direction;

the distance between the overlap region and the channel region of the drive transistor is a distance between an edge of the overlap region adjacent to the fifth channel segment in the second direction and an edge of the fifth channel segment adjacent to the overlap region in the second direction.

7. The display substrate of claim 5, wherein conductivity of the second region of the drive transistor is greater than conductivity of the channel region of the drive transistor.

8. The display substrate of claim 1, wherein the pixel drive circuit further comprises a third conductive layer, the third conductive layer at least comprises a first power supply line, and the first power supply line is connected to the second electrode plate through a power via hole; a middle part of the second electrode plate is provided with an opening, and the power via hole is disposed between the opening and the overlap region.

9. The display substrate of claim 8, wherein a distance between an edge of the power via hole adjacent to the opening in the first direction and an edge of the opening adjacent to the power via hole in the first direction is greater than or equal to a distance between an edge of the power via hole adjacent to the overlap region in the first direction and an edge of the overlap region adjacent to the power via hole in the first direction.

10. The display substrate of claim 9, wherein the distance between an edge of the power via hole adjacent to the opening in the first direction and an edge of the opening adjacent to the power via hole in the first direction is greater than or equal to 0.85 µm.

11. The display substrate of claim 9, wherein the distance between an edge of the power via hole adjacent to the opening in the first direction and an edge of the opening adjacent to the power via hole in the first direction is 1.5 µm to 3.0 µm.

12. The display substrate of claim 9, wherein the distance between an edge of the power via hole adjacent to the overlap region in the first direction and an edge of the overlap region adjacent to the power via hole in the first direction is greater than or equal to 0.6 µm.

13. The display substrate of claim 9, wherein the distance between an edge of the power via hole adjacent to the overlap region in the first direction and an edge of the overlap region adjacent to the power via hole in the first direction is 1.2 µm to 3.0 µm.

14. A preparation method for a display substrate, wherein in a direction parallel to the display substrate, the display substrate comprises a plurality of sub-pixels, at least one sub-pixel comprises a pixel drive circuit and a light emitting device connected to the pixel drive circuit, and the pixel drive circuit at least comprises a drive transistor and a storage capacitor, the method comprising:

sequentially forming a semiconductor layer, a first conductive layer and a second conductive layer on a substrate, wherein the semiconductor layer at least comprises an active layer of the drive transistor; the first conductive layer at least comprises a first electrode plate of the storage capacitor, and the second conductive layer at least comprises a second electrode plate of the storage capacitor and an electrode plate connection line; the electrode plate connection line is connected to a second electrode plate of an adjacent sub-pixel in a first direction; and the first direction is a direction of a sub-pixel row;

an active layer of the drive transistor at least comprises a channel region, and the channel region at least comprises a first channel segment extending along the first direction and a second channel segment extending along a second direction, wherein the second direction is a direction of a sub-pixel column; the channel region has a second direction effective length in the second direction, and the second direction effective length is a length of the second channel segment in the second direction; and there is an overlap region between an orthographic projection of the electrode plate connection line on the substrate and an orthographic projection of the semiconductor layer on the substrate, and a distance between the overlap region and the channel region of the drive transistor is greater than or equal to the effective length in the second direction.

15. The preparation method for the display substrate of claim 14, further comprising:

forming a third conductive layer, wherein the third conductive layer at least comprises a first power supply line, and the first power supply line is connected to the second electrode plate through a power via hole; the second electrode plate is provided with an opening, and the power via hole is disposed between the opening and the overlap region; a distance between an edge of the power via hole adjacent to the opening in the first direction and an edge of the opening adjacent to the power via hole in the first direction is greater than or equal to a distance between an edge of the power via hole adjacent to the overlap region in the first direction and an edge of the overlap region adjacent to the power via hole in the first direction.

* * * * *